(12) United States Patent
Harrington, III

(10) Patent No.: US 12,317,559 B2
(45) Date of Patent: May 27, 2025

(54) WIDE BANDGAP UNIPOLAR/BIPOLAR TRANSISTOR

(71) Applicant: Wolfspeed, Inc., Durham, NC (US)

(72) Inventor: Thomas E. Harrington, III, Durham, NC (US)

(73) Assignee: Wolfspeed, Inc., Durham, NC (US)

( * ) Notice: Subject to any disclaimer, the term of this patent is extended or adjusted under 35 U.S.C. 154(b) by 522 days.

(21) Appl. No.: 17/589,929

(22) Filed: Feb. 1, 2022

(65) Prior Publication Data
US 2023/0246073 A1    Aug. 3, 2023

(51) Int. Cl.
*H10D 62/17*   (2025.01)
*H10D 12/00*   (2025.01)
*H10D 12/01*   (2025.01)
*H10D 30/66*   (2025.01)
*H10D 62/10*   (2025.01)
*H10D 62/13*   (2025.01)
*H10D 62/53*   (2025.01)
*H10D 62/832*  (2025.01)

(52) U.S. Cl.
CPC ......... *H10D 62/393* (2025.01); *H10D 12/031* (2025.01); *H10D 12/481* (2025.01); *H10D 30/668* (2025.01); *H10D 62/112* (2025.01); *H10D 62/142* (2025.01); *H10D 62/53* (2025.01); *H10D 62/8325* (2025.01)

(58) Field of Classification Search
CPC ............ H01L 29/1095; H01L 29/0638; H01L 29/0834; H01L 29/1608; H01L 29/32; H01L 29/66068; H01L 29/7397; H01L 29/7813; H10D 12/031; H10D 12/481; H10D 30/668; H10D 62/393; H10D 62/53; H10D 62/112; H10D 62/142; H10D 62/8325
USPC ......................................... 257/77
See application file for complete search history.

(56) References Cited

U.S. PATENT DOCUMENTS

| | | | |
|---|---|---|---|
| 7,361,970 B2 | 4/2008 | Barthelmess et al. | |
| 8,344,415 B2 * | 1/2013 | Ruething | H01L 29/7397 257/163 |
| 9,012,311 B2 * | 4/2015 | Pfirsch | H01L 29/861 438/455 |
| 9,419,117 B2 | 8/2016 | Aketa et al. | |
| 10,580,884 B2 | 3/2020 | Harrington et al. | |
| 2005/0280076 A1 | 12/2005 | Barthelmess et al. | |

(Continued)

OTHER PUBLICATIONS

Notification of Transmittal of the International Search Report and the Written Opinion of the International Searching Authority, or the Declaration, in corresponding PCT Application No. PCT/US2023/061616 (Jun. 12, 2023).

(Continued)

*Primary Examiner* — Igwe U Anya
(74) *Attorney, Agent, or Firm* — Myers Bigel, P.A.

(57) ABSTRACT

A power semiconductor device includes a semiconductor layer structure comprising a drift region of a first conductivity type, and first and second contacts on the semiconductor layer structure. The drift region comprises a wide bandgap semiconductor material, and is configured to provide unipolar conduction between the first and second contacts below a current density threshold, and bipolar conduction between the first and second contacts above the current density threshold. Related devices and fabrication methods are also discussed.

43 Claims, 15 Drawing Sheets

(56) References Cited

U.S. PATENT DOCUMENTS

| | | | |
|---|---|---|---|
| 2008/0135871 A1* | 6/2008 | Ruething | H01L 29/7397 |
| | | | 257/E29.198 |
| 2009/0032851 A1 | 2/2009 | Pfirsch et al. | |
| 2012/0018846 A1* | 1/2012 | Baburske | H01L 29/66136 |
| | | | 257/E29.174 |
| 2012/0056198 A1* | 3/2012 | Ota | H01L 29/868 |
| | | | 438/105 |
| 2015/0061089 A1* | 3/2015 | Siemieniec | H01L 21/266 |
| | | | 257/654 |
| 2015/0236143 A1* | 8/2015 | Pfirsch | H01L 29/0696 |
| | | | 257/133 |
| 2017/0018548 A1* | 1/2017 | Laven | H01L 29/0834 |
| 2017/0236935 A1* | 8/2017 | Ebihara | H01L 29/7815 |
| | | | 257/77 |
| 2018/0261691 A1* | 9/2018 | Harrington, III | H01L 29/7396 |
| 2021/0013320 A1* | 1/2021 | Schulze | H01L 29/1095 |

OTHER PUBLICATIONS

"What is a reverse-conducting IGBT (RC-IGBT)?" Toshiba Electronic Devices & Storage Corporation, Retrieved from: https://toshiba.semicon-storage.com/us/semiconductor/knowledge/faq/mosfet_igbt/igbt-006.html (2022).

Notice of Preliminary Rejection corresponding to Korean Patent Application No. 10-2024-7028371 (Feb. 20, 2025).

\* cited by examiner

WIDE BANDGAP UNIPOLAR/BIPOLAR TRANSISTOR

FIELD

The present invention relates to semiconductor devices and, more particularly, to power semiconductor devices.

BACKGROUND

Power semiconductor devices are used to carry large currents and support high voltages. A wide variety of power semiconductor devices are known in the art including, for example, power Metal Insulator Semiconductor Field Effect Transistors ("MISFETs", including Metal Oxide Semiconductor FETs ("MOSFETs")), bipolar junction transistors ("BJTs"), Insulated Gate Bipolar Transistors ("IGBT"), Junction Barrier Schottky diodes, Gate Turn-Off Transistors ("GTO"), MOS-controlled thyristors, and various other devices. These power semiconductor devices are generally fabricated from wide bandgap semiconductor materials, for example, silicon carbide ("SiC") or Group III nitride (e.g., gallium nitride ("GaN"))-based semiconductor materials. Herein, a wide bandgap semiconductor material refers to a semiconductor material having a bandgap greater than about 1.40 eV, for example, greater than about 2 eV.

A conventional power semiconductor device typically has a semiconductor substrate having a first conductivity type (e.g., a n-type substrate) on which an epitaxial layer structure having the first conductivity type (e.g., n-type) is formed. A portion of this epitaxial layer structure (which may comprise one or more separate layers) functions as a drift layer or drift region of the power semiconductor device. The device typically includes an "active region," which includes one or more "unit cell" structures that have a junction, for example, a p-n junction. The active region may be formed on and/or in the drift region. The active region acts as a main junction for blocking voltage in the reverse bias direction and providing current flow in the forward bias direction. The power semiconductor device may also have an edge termination in a termination region that is adjacent the active region. One or more power semiconductor devices may be formed on the substrate, and each power semiconductor device will typically have its own edge termination. After the substrate is fully processed, the resultant structure may be diced to separate the individual edge-terminated power semiconductor devices.

Power semiconductor devices may have a unit cell configuration in which a large number of individual unit cell structures of the active region are electrically connected in parallel to function as a single power semiconductor device. In high power applications, such a power semiconductor device may include thousands or tens of thousands of unit cells implemented in a single chip or "die." A die or chip may include a small block of semiconducting material or other substrate in which electronic circuit elements are fabricated.

Power semiconductor devices are designed to block (in the forward or reverse blocking state) or pass (in the forward operating state) large voltages and/or currents. For example, in the blocking state, a power semiconductor device may be designed to sustain hundreds or thousands of volts of electric potential. As the applied voltage approaches or passes the voltage level that the device is designed to block, non-trivial levels of current (referred to as leakage current) may begin to flow through the power semiconductor device. The blocking capability of the device may be a function of, among other things, the doping density/concentration and thickness of the drift region. If the voltage applied to the device is increased past the breakdown voltage to a critical level, the increasing electric field may result in an uncontrollable and undesirable runaway generation of charge carriers within the semiconductor device, leading to a condition known as avalanche breakdown.

Power semiconductor devices can have a lateral structure or a vertical structure. In a device having a lateral structure, the terminals of the device (e.g., the drain, gate and source terminals for a power MOSFET device) are on the same major surface (e.g., top or bottom) of a semiconductor layer structure. In contrast, in a device having a vertical structure, at least one terminal is provided on each major surface of the semiconductor layer structure (e.g., in a vertical MOSFET device, the source may be on the top surface of the semiconductor layer structure and the drain may be on the bottom surface of the semiconductor layer structure). The semiconductor layer structure may or may not include an underlying substrate.

SUMMARY

According to some embodiments, a power semiconductor device includes a semiconductor layer structure comprising a wide bandgap semiconductor material. The semiconductor layer structure includes a drift region of a first conductivity type, and first and second contacts on the semiconductor layer structure. The drift region comprises a wide bandgap semiconductor material, and is configured to provide unipolar conduction between the first and second contacts below a current density threshold, and bipolar conduction between the first and second contacts above the current density threshold.

In some embodiments, the drift region may have a concentration of dopants of the first conductivity type of greater than about $5 \times 10^{14}$ atoms/cm$^3$. A concentration of dopants of a second conductivity type in the drift region may be less than that of the first conductivity type.

In some embodiments, the first and second contacts may be on opposing first and second surfaces of the semiconductor layer structure, and the drift region further comprises a plurality of discrete minority carrier recombination sites that are spaced apart from the first and second surfaces.

In some embodiments, a gate may be provided adjacent a first surface of the semiconductor layer structure. The first and second contacts may be a source contact on the first surface of the semiconductor layer structure, and a drain contact on a second surface of the semiconductor layer structure opposite the first surface.

In some embodiments, the semiconductor layer structure may further include a collector region of a second conductivity type between the drift region and the drain contact, and at least one drain gap of the first conductivity type in the collector region adjacent the drain contact.

In some embodiments, the semiconductor layer structure may further include a field stop region of the first conductivity type between the collector region and the drift region.

In some embodiments, the semiconductor layer structure may further include a semiconductor layer between the drain contact and the drift region. The semiconductor layer may define a heterojunction with the wide bandgap semiconductor material of the drift region, and may include the field stop region, the collector region, and the at least one drain gap therein.

In some embodiments, the discrete minority carrier recombination sites may be a plurality of doped regions of the first and/or second conductivity types having a higher dopant concentration than the drift region.

In some embodiments, the discrete minority carrier recombination sites may be defects in a crystal lattice of the drift region.

In some embodiments, the discrete minority carrier recombination sites may include argon and/or hydrogen.

In some embodiments, the discrete minority carrier recombination sites may be positioned at a depth that is about 15% to about 85% of a thickness defined between the first and second surfaces of the semiconductor layer structure.

In some embodiments, the first concentration of dopants in the drift region may be about $5 \times 10^{14}$ to $5 \times 10^{17}$ atoms/$cm^3$.

According to some embodiments, a power semiconductor device includes a semiconductor layer structure comprising a drift region of a first conductivity type and a collector region of a second conductivity type, and first and second contacts on opposing first and second surfaces of the semiconductor layer structure, respectively. The collector region is between the drift region and the second surface. The drift region includes a first concentration of dopants of the first conductivity type of greater than about $5 \times 10^{14}$ atoms/$cm^3$. A second concentration of dopants of the second conductivity type in the drift region is less than the first concentration.

In some embodiments, the drift region may be configured to provide unipolar conduction between the first and second contacts below a current density threshold, and bipolar conduction between the first and second contacts above the current density threshold.

In some embodiments, the semiconductor layer structure may further include a field stop region of the first conductivity type between the collector region and the drift region.

In some embodiments, the semiconductor layer structure may further include at least one drain gap of the first conductivity type in the collector region.

In some embodiments, the semiconductor layer structure may further include source regions of the first conductivity type and well regions of a second conductivity type adjacent the first surface, and the first and second contacts may include a source contact on the first surface and a drain contact on the second surface.

In some embodiments, the drift region may include a wide bandgap semiconductor material. A semiconductor layer may be provided between the drain contact and the drift region. The semiconductor layer may define a heterojunction with the wide bandgap semiconductor material of the drift region and may include the field stop region, the collector region, and the at least one drain gap.

In some embodiments, the drift region may further include a plurality of discrete minority carrier recombination sites that are spaced apart from the opposing first and second surfaces.

In some embodiments, the discrete minority carrier recombination sites may be a plurality of doped regions of the first and/or second conductivity types having a higher dopant concentration than the drift region.

In some embodiments, the discrete minority carrier recombination sites may be defects in a crystal lattice of the drift region.

In some embodiments, the discrete minority carrier recombination sites may include argon and/or hydrogen.

In some embodiments, the discrete minority carrier recombination sites may be positioned at a depth that is about 15% to about 85% of a thickness defined between the first and second surfaces of the semiconductor layer structure.

In some embodiments, the first concentration of dopants in the drift region may be about $5 \times 10^{14}$ to $5 \times 10^{17}$ atoms/$cm^3$.

According to some embodiments, a power semiconductor device includes a semiconductor layer structure comprising a drift region of a first conductivity type, and first and second contacts on opposing first and second surfaces of the semiconductor layer structure, respectively. The drift region is configured to provide majority carrier conduction between the first and second contacts, and comprises a plurality of discrete minority carrier recombination sites that are spaced apart from the first and second surfaces.

In some embodiments, the semiconductor layer structure may further include source regions of the first conductivity type and well regions of a second conductivity type adjacent the first surface, and the first and second contacts may be a source contact on the first surface and a drain contact on the second surface.

In some embodiments, the semiconductor layer structure may further include a gate adjacent the first surface, and the minority carrier recombination sites may be between the gate and the drain contact.

In some embodiments, the discrete minority carrier recombination sites may be positioned at a depth that is about 15% to about 85% of a thickness defined between the first and second surfaces of the semiconductor layer structure.

In some embodiments, the discrete minority carrier recombination sites may be laterally spaced apart from one another by a spacing of about 0.2 μm to about 2.0 μm.

In some embodiments, the discrete minority carrier recombination sites may be a plurality of doped regions of the first and/or second conductivity types having a higher dopant concentration than the drift region.

In some embodiments, the discrete minority carrier recombination sites may be defects in a crystal lattice of the drift region.

In some embodiments, the discrete minority carrier recombination sites may include argon and/or hydrogen.

In some embodiments, the semiconductor layer structure may further include a collector region of the second conductivity type between the drift region and the drain contact; a field stop region of the first conductivity type between the collector region and the drift region; and at least one drain gap of the first conductivity type in the collector region adjacent the drain contact.

In some embodiments, the drift region may include a wide bandgap semiconductor material.

In some embodiments, the semiconductor layer structure may further include a semiconductor layer between the drain contact and the drift region, where the semiconductor layer defines a heterojunction with the wide bandgap semiconductor material of the drift region and comprises the field stop region, the collector region, and the at least one drain gap.

In some embodiments, the drift region may include a concentration of dopants of the first conductivity type of about $5 \times 10^{14}$ to $5 \times 10^{17}$ atoms/$cm^3$, where a concentration of dopants of the second conductivity type in the drift region is less than that of the first conductivity type.

In some embodiments, the drift region may be configured to provide unipolar conduction of the majority carriers between the first and second contacts below a current density threshold, and bipolar conduction of minority carriers and the majority carriers between the first and second contacts above the current density threshold.

According to some embodiments, a method of fabricating a power semiconductor device includes forming a semiconductor layer structure comprising a drift region of a first conductivity type, and forming a plurality of discrete minority carrier recombination sites in the drift region, where the discrete minority carrier recombination sites are spaced apart from opposing first and second surfaces of the semiconductor layer structure.

In some embodiments, forming the semiconductor layer structure may include forming the drift region on a substrate using an epitaxial growth process such that the first surface is opposite the substrate, and forming the discrete minority carrier recombination sites may include implanting ions into the drift region.

In some embodiments, the implanting may be performed from the first surface.

In some embodiments, the implanting may be performed during a break in the epitaxial growth processes.

In some embodiments, the method may further include removing the substrate responsive to completion of the epitaxial growth process, and the implanting may be performed from the second surface.

In some embodiments, the ions may include dopants of the first and/or second conductivity types, and the implanting may form the discrete minority carrier recombination sites as a plurality of doped regions with a higher dopant concentration than the drift region.

In some embodiments, the ions may include a neutral species, and the implanting may form the discrete minority carrier recombination sites as defects in a crystal lattice of the drift region.

In some embodiments, the implanting may form the discrete minority carrier recombination sites at a depth that is about 15% to about 85% of a thickness defined between the first and second surfaces of the semiconductor layer structure.

In some embodiments, forming a semiconductor layer structure may further include forming a field stop region of the first conductivity type adjacent the drift region, forming a collector region of the second conductivity type adjacent the field stop region, and forming and at least one drain gap of the first conductivity type between portions of the collector region.

In some embodiments, the at least one drain gap may be configured to provide unipolar conduction between first and second contacts on the opposing first and second surfaces of the semiconductor layer structure below a current density threshold. A p-n junction between the collector region and the field stop region may be configured to provide bipolar conduction between the first and second contacts above the current density threshold.

In some embodiments, forming the backside structure may include implanting ions into the second surface to form the field stop region, the collector region, and the at least one drain gap.

In some embodiments, forming the backside structure may include removing the substrate to expose a surface of the drift region opposite the first surface, forming a semiconductor layer on the surface of the drift region, wherein the semiconductor layer defines a heterojunction with the wide bandgap semiconductor material of the drift region, and implanting ions into the semiconductor layer to form the field stop region, the collector region, and the at least one drain gap.

In some embodiments, the drift region may include a concentration of dopants of the first conductivity type of about $5 \times 10^{14}$ to $5 \times 10^{17}$ atoms/cm$^3$, where a concentration of dopants of a second conductivity type in the drift region is less than that of the first conductivity type.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION OF EMBODIMENTS

Figure 1A:
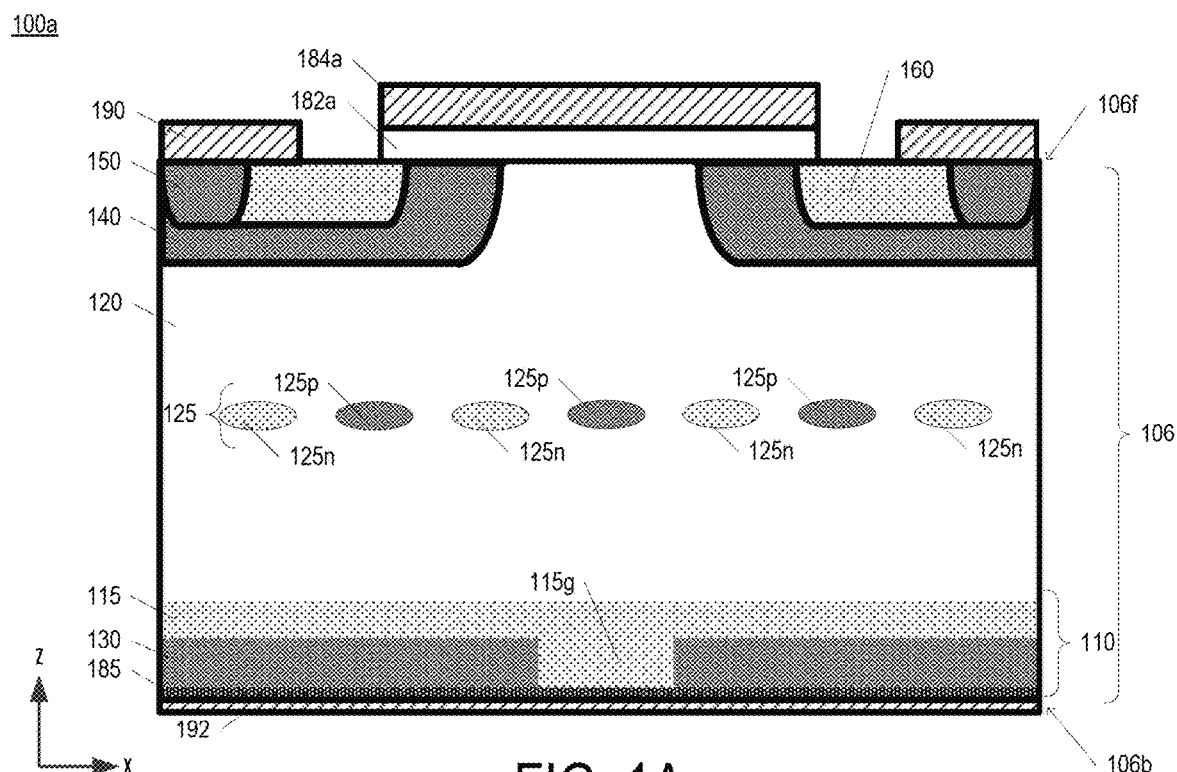
FIGS. 1A and 1B are cross-sectional views illustrating example structures of planar and trench power semiconductor devices, respectively, according to some embodiments of the present invention.

Vertical power semiconductor devices that include a MOSFET transistor may be implemented using several different wide bandgap semiconductor structures. For example, a planar structure may include a gate electrode design in which the gate electrode of the transistor is formed on a top surface of the semiconductor layer structure. A trench structure may include the gate electrode that extends into (i.e., is buried in) a trench in the surface of the semiconductor layer structure, and may also be referred to as a gate trench MOSFET. These vertical power semiconductor device structures utilize a p-n junction barrier and the inversion of a doped well region to provide electron flow from source to drain in a vertical direction (e.g., between opposing surfaces of the semiconductor layer structure). Although described and illustrated herein with reference to regions of specific conductivity types (i.e., n-type and p-type) by way of example, it will be understood that the conductivity types of the regions in any of the illustrated examples may be reversed (i.e., p-type and n-type) in accordance with embodiments of the present invention. Herein, the term "semiconductor layer structure" refers to a structure that includes one or more semiconductor layers, for example, semiconductor substrates and/or semiconductor epitaxial layers.

Some embodiments of the present invention may arise from realization that, power MOSFET devices may be capable of fast switching and hence low switching losses, but may have limited current-density capability, all of which may be due to the majority-carrier nature of the device. In contrast, IGBT devices are minority-carrier devices that may have high current-density capability, but may be limited in switching speed by minority-carrier-lifetime-induced tail current, which can result in extended turn-off time and thus higher switch-off energy loss compared to MOSFET devices.

Embodiments of the present invention include devices and related methods that can achieve many of the advantages of both field-effect and bipolar devices, including fast switching speeds and high current density capability. In particular, some embodiments of the present invention provide voltage-controlled power semiconductor devices with unipolar conduction at low current densities, which transitions to bipolar conduction at high current densities. The bipolar conduction is configured to switch on after the unipolar conduction is initiated. The bipolar conduction is configured to switch off before the unipolar conduction switches off. The drift region may include discrete minority carrier recombination sites, thereby enabling faster switching due to a reduction in minority carrier tail current due to the enhanced recombination of minority carriers. For example, in some embodiments the drift region includes heavily-doped regions of the first (e.g., n-type) and/or second (e.g., p-type) conductivity types that may provide a reduction in minority carrier tail current due to minority carriers beginning recombination in the interval between bipolar conduction switch off and unipolar conduction switch off, allowing the device to switch off more rapidly.

In some embodiments, wide bandgap (WBG) materials may be used to form a merged or tandem field-effect/bipolar transistor devices including a WBG transistor (such as a SiC transistor) that begins conduction as a fast-turn-on FET (majority-carrier device), and subsequently switches to a high-current density bipolar transistor (minority-carrier, conductivity-modulated device) when a certain level or threshold of FET current density jth is reached, allowing the device to handle the burst current requirements of many switching applications. The discrete minority carrier recombination sites can be provided at one or more depths over the thickness of the drift region to allow the device to rapidly extinguish minority carriers when switching off, and thus achieve faster switching.

Embodiments of the present invention may allow for field effect/bipolar power transistor devices including thinner, lower resistance drift regions for higher-voltage operation, without charge-balanced junctions (that is, without having substantially equal amounts of doping between n- and p-type regions in the drift region), for example, due to superior critical electric field properties provided by wide bandgap (WBG) materials such as SiC. The width, depth, spacing, doping, and/or density of the discrete minority carrier recombination sites in the drift region may be selected or optimized to provide minority carrier absorption, without constraints as to charge balancing, and can be selected to balance the tradeoff between faster turn-off speed (e.g., using more recombination sites) and lower on-resistance (e.g., using fewer recombination sites).

Figure 1B:
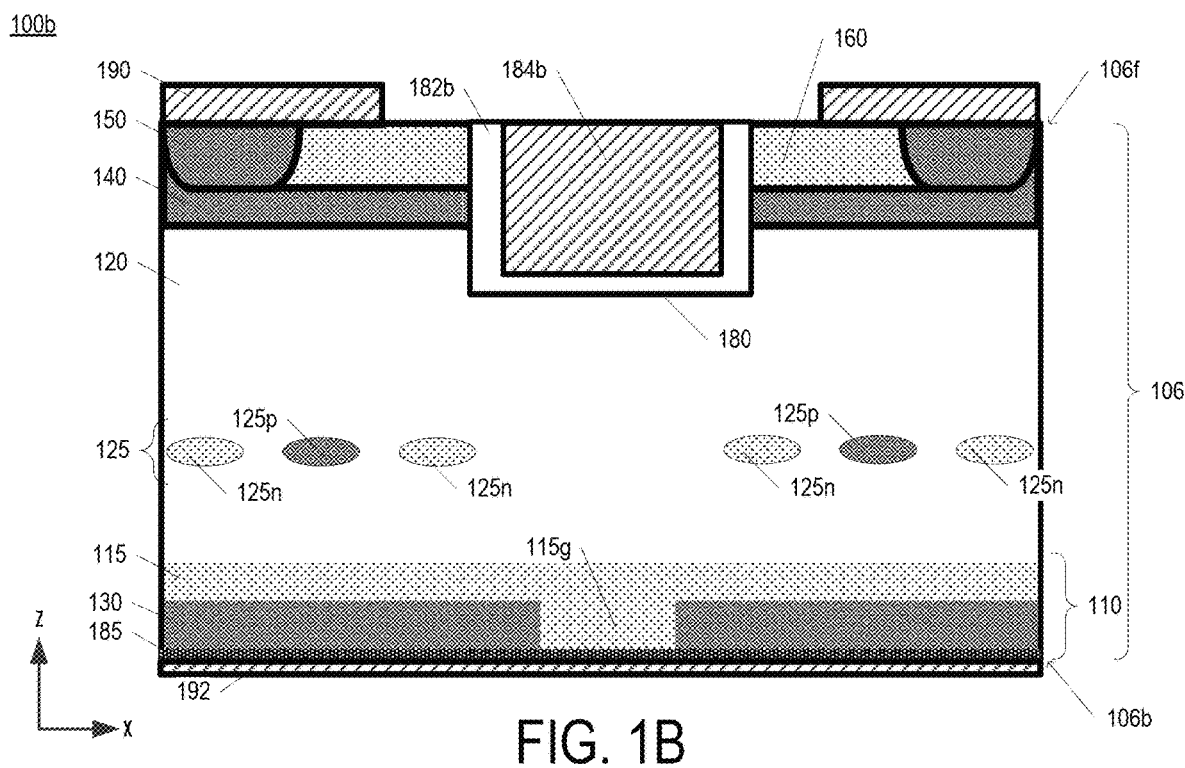
Figure 2A:
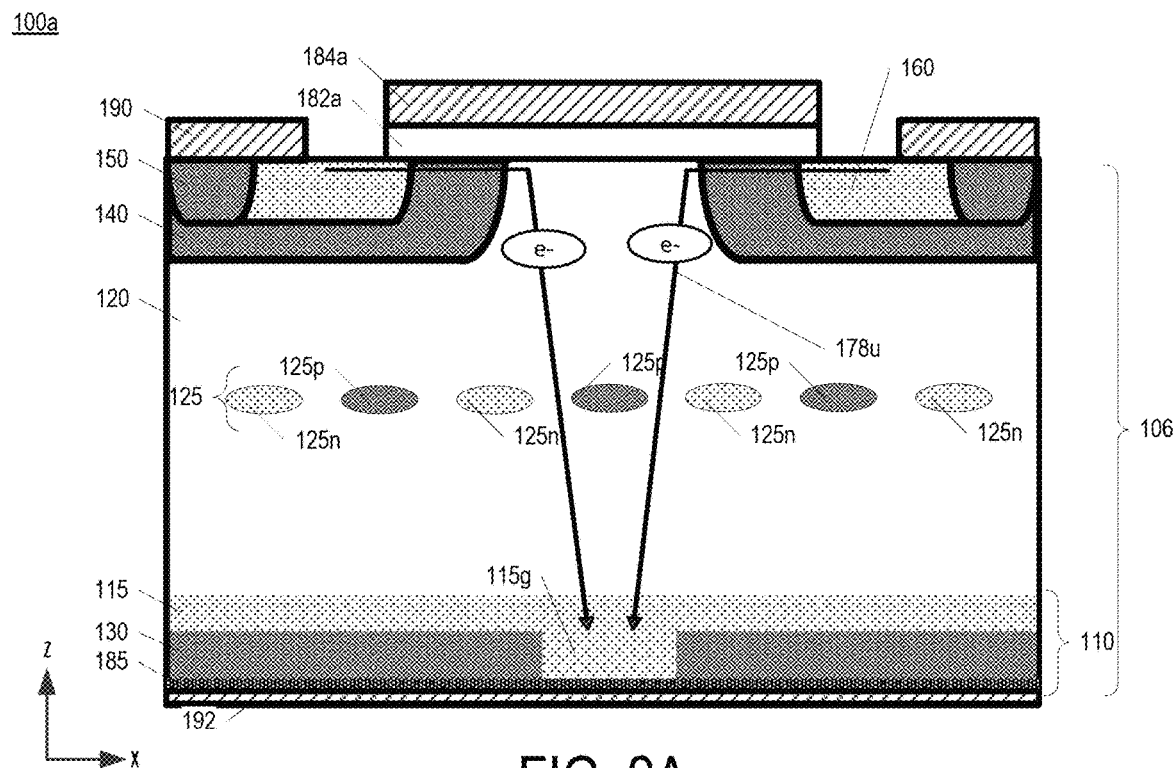
FIGS. 2A and 2B are cross-sectional views illustrating example unipolar operation of planar and trench power semiconductor devices, respectively, according to some embodiments of the present invention.
Figure 2B:
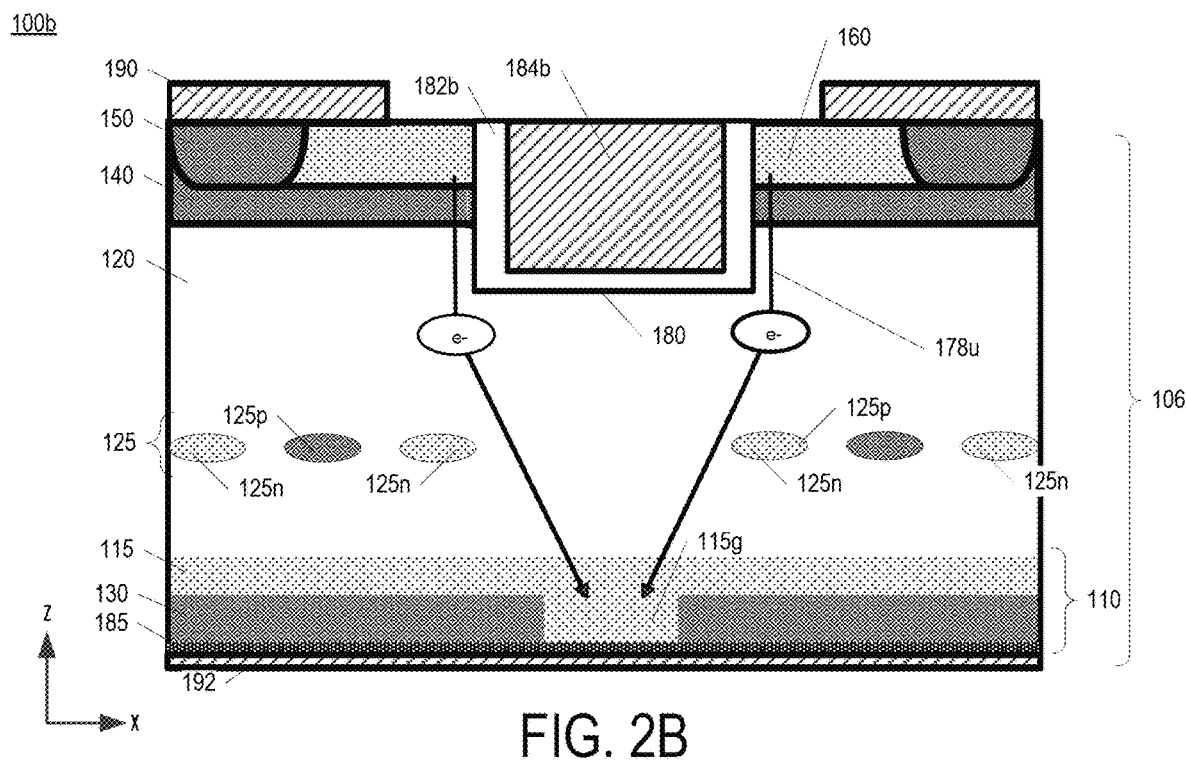
Figure 3A:
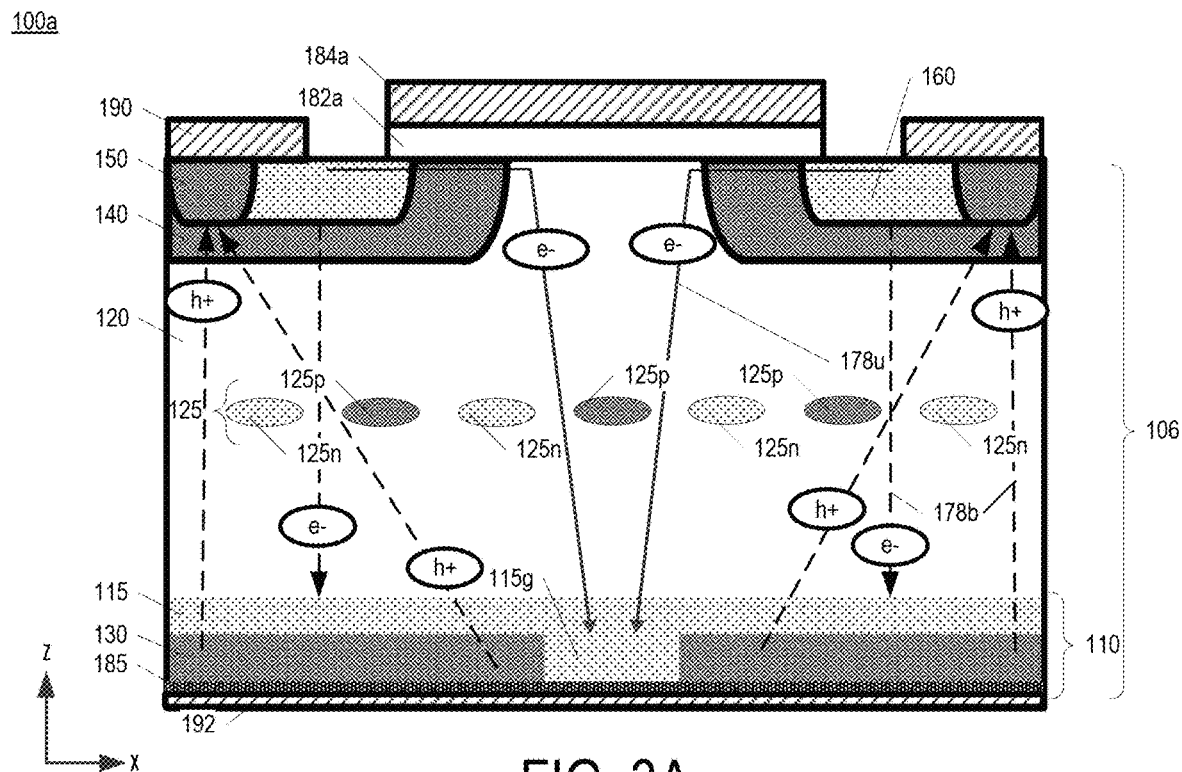
FIGS. 3A and 3B are cross-sectional views illustrating example bipolar operation of planar and trench power semiconductor devices, respectively, according to some embodiments of the present invention.
Figure 3B:
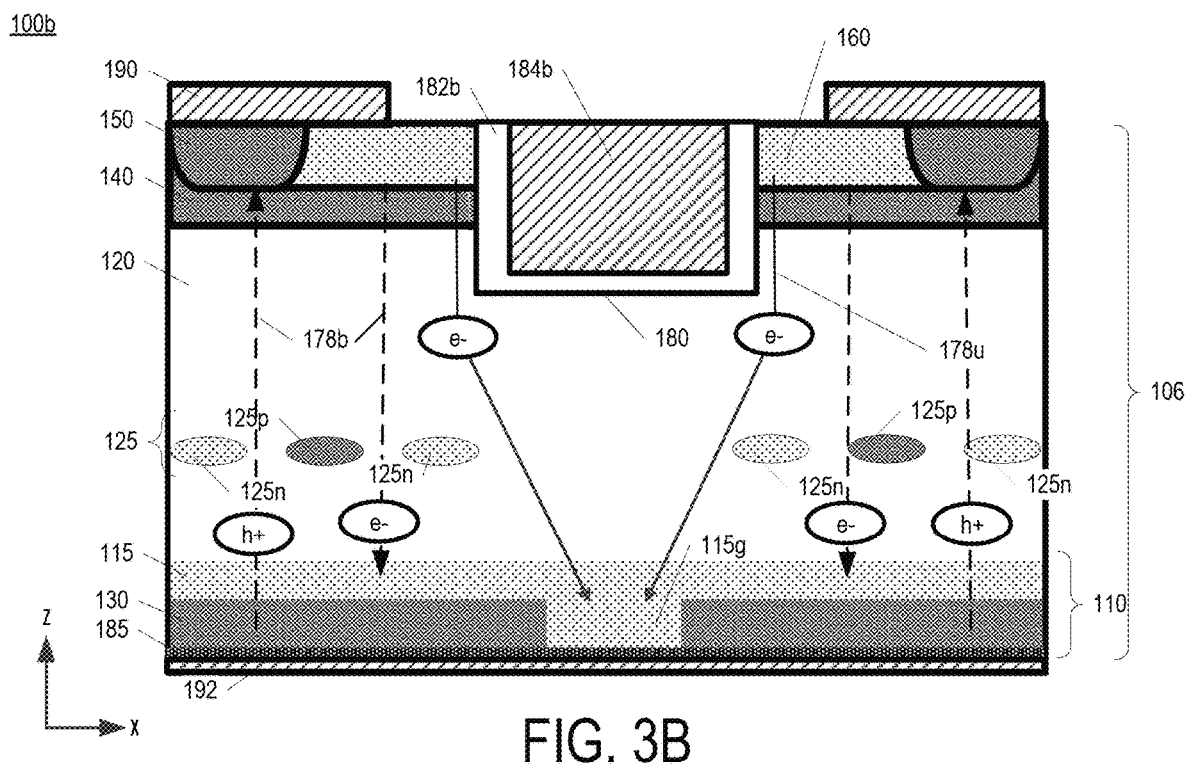

FIGS. 1A to 3B are schematic cross-sectional views (e.g., along the X- and Z-directions) illustrating examples of vertical field effect/bipolar power semiconductor devices, illustrated as a partial unit cell of a planar device 100a or a trench device 100b (collectively, 100). In particular, FIGS. 1A, 2A, and 3A illustrate the structure and operation of the planar device 100a, while FIGS. 1B, 2B, and 3B illustrate the structure and operation of the trench device 100b. It will be understood that the unit cells 100a, 100b may be replicated in one or more dimensions, in some embodiments in combination with conventional transistor structures, to define a power semiconductor device as described herein.

Referring to FIGS. 1A and 1B, the power devices 100a, 100b (collectively 100) may include a semiconductor layer structure 106 having a drift region 120 of a first conductivity type (e.g., n-type), first regions 160 of the first conductivity type, and second regions 140, 150 of a second conductivity type (e.g., p-type), and respective contacts 190, 192 on the semiconductor layer structure 106 (e.g., on opposing first and second surfaces 106f and 106b). The drift region 120 includes a wide bandgap semiconductor material, such as SiC or a Group III nitride. The drift region 120 may further include discrete minority carrier recombination sites 125 that are spaced apart from the first and second surfaces 106f and 106b. As explained in greater detail, the drift region 120 is configured to provide unipolar conduction 178u between the respective contacts 190, 192 below a current density threshold $j_{th}$, and bipolar conduction 178b between the respective contacts 190, 192 above the current density threshold $j_{th}$.

As shown in FIGS. 1A and 1B, the power devices 100 may be formed on a layer or substrate 110' (see FIGS. 7A and 7B) of the first conductivity type (e.g., n-type), for example, silicon carbide. The drift layer or region 120 of the first conductivity type is provided on the layer 110', for example, by epitaxial growth. The drift region 120 may include impurities of the first conductivity type (e.g., nitrogen (N) or phosphorous (P) for n-type, or boron (B) for a p-type). The drift region 120 may include a concentration of dopants of the first conductivity type of greater than about $5\times10^{14}$ atoms/cm$^3$, for example, about $5\times10^{14}$ to $5\times10^{17}$ atoms/cm$^3$, about $5\times10^{15}$ to $5\times10^{16}$, about $8\times10^{15}$ to $2\times10^{16}$ atoms/cm$^3$, or about $9\times10^{15}$ to $1\times10^{16}$ atoms/cm$^3$. The doping of the drift region 120 may be substantially greater than that of an IGBT device (which, for example, may include a concentration of dopants of the first conductivity type of about $1\times10^{13}$ to $3\times10^{13}$ atoms/cm$^3$, or at most about $3\times10^{14}$ atoms/cm$^3$). The layer 110' may be a n-type (e.g., n$^+$) silicon carbide substrate, and a lightly-doped (e.g., n$^-$) n-type drift layer or region 120 (e.g., a 4H-SiC epitaxial layer) may be epitaxially grown on the layer 110'. In some embodiments, a portion of the drift region 120 may include a current spreading layer ("CSL") of the first conductivity type and having a higher doping or dopant concentration than the drift region 120. The drift region 120 may not be charge balanced; i.e., a concentration of dopants of the second conductivity type in the drift region may be less than or otherwise substantially unequal to the concentration of dopants of the first conductivity type.

Moderately- or heavily-doped regions of a second conductivity type (e.g., p-type) are formed (for example, by epitaxial growth or implantation) on the drift region 120 adjacent the first surface 106f and act as body or well regions (or "wells") 140 for the devices 100. Heavily-doped source regions 160 of the first conductivity type (e.g., n+) are formed in upper portions of the well regions 140 adjacent the first surface 106f, for example, via ion implantation. The source regions 160 may be doped with n-type impurities, and may have a dopant concentration of about $5\times10^{18}$ to $5\times10^{21}$ atoms/cm$^3$, for example, about $8\times10^{18}$ to $1\times10^{21}$ atoms/cm$^3$, about $1\times10^{19}$ to $5\times10^{20}$ atoms/cm$^3$, or about $5\times10^{19}$ to $1\times10^{20}$ atoms/cm$^3$. That is, the source region 160 has a dopant concentration that is greater than the dopant concentration of the drift region 120, e.g., by a factor of about 10 or more in some embodiments. Heavily-doped regions 150 of the second conductivity type (e.g., p+; which may also be referred to as well ties) are likewise formed in upper portions of the well regions 140 adjacent the first surface 106f, for example, via ion implantation. The regions 150 may be doped with p-type impurities, and may have a dopant concentration of about $5\times10^{18}$ to $5\times10^{20}$ atoms/cm$^3$, for example, about $1\times10^{19}$ to $3\times10^{20}$ atoms/cm$^3$, or about $2\times10^{19}$ to $2\times10^{20}$ atoms/cm$^3$. The regions/well ties 150 can provide a relatively low resistance and ohmic contact to the wells 140. A heavily doped drain region 185 with a dopant concentration that is greater than the dopant concentration of the drift region 120 is provided adjacent the second surface 106b. The substrate or layer 110' (including backside structures 110 formed therein or in replacement thereof), drift region 120 (including current spreading layer), well regions 140, source regions 160, and/or various regions/patterns formed therein, are included in the silicon carbide (or other wide bandgap semiconductor) layer structure 106.

A control terminal 184 is provided on portions of the drift region 120, the well regions 140, and the source regions 160. For example, a gate insulating layer 182a, 182b (collectively 182), such as an oxide layer, is formed on portions of the drift region 120, the well regions 140, and the source regions 160 adjacent the first surface 106f. A gate electrode (or "gate") 184a, 184b (collectively 184) is formed on the gate oxide layer 182. The gate insulating layer 182 and the gate 184 thereon may be collectively referred to herein as the gate structure 182/184.

More particularly, in the planar devices 100a of FIGS. 1A, 2A and 3A, the gate insulating layer 182a is formed on portions of the drift region 120, the well regions 140, and the source regions 160 adjacent the first surface 106f of the semiconductor layer structure 106, and the gate 184a is formed on the insulating oxide layer 182a extending along the surface 106f of the structure 106. A unipolar conduction channel 178a for each planar device unit cell 100a (with conduction shown by solid arrows in FIGS. 2A and 3A) is defined through the wells 140 and the portions of the drift region 120 underneath the gate 184a. For example, the inversion channel 178u of planar SiC device may be on the Si-face of SiC.

In the trench devices 100b of FIGS. 1B, 2B, and 3B, a gate trench 180 is formed extending from the first surface 106f of the semiconductor layer structure 106 into the drift region 120, the gate ox insulating ide layer 182b is formed on sidewalls and a bottom surface of the gate trench, and the gate 184b is formed on the gate oxide layer 182a to fill the gate trench. Unipolar conduction channels 178u for each trench device unit cell 100b (with conduction shown by solid arrows in FIGS. 2B and 3B) are defined vertically through the wells 140 along sidewalls of the gate trench 180. For example, the inversion channel 178u of a trench SiC device may be along the sidewalls of the trench, on the a-face or the m-face of SiC. The trench devices 100b may further include shielding patterns underneath the gate trench 180 in order to reduce the electric field levels in the gate insulating layer 182b, particularly at corners of the gate trenches 180 where the electric field levels may be more concentrated. The shielding patterns (not shown) may include doped semiconductor layers having the same conductivity type (in this example, p-type) as the well regions 140, but with a greater dopant concentration.

As shown in FIGS. 1A to 3B, the power devices 100a, 100b each include conductive contacts 190 and 192, shown by way of example on opposing surfaces 106f and 106b of the semiconductor layer structure 106. For example, the contacts 190 may be source contacts on the source regions 160, and the contact 192 may be a drain contact. The contacts 190 and 192 may be ohmic contacts. An ohmic contact may refer to a non-rectifying electrical junction between two conductors (e.g., a metal and a semiconductor) that has a linear current-voltage (I-V) curve. Suitable metals for forming ohmic contacts may include refractory metals, such as Ti, W, titanium tungsten (TiW), silicon (Si), titanium tungsten nitride (TiWN), tungsten silicide (WSi), rhenium (Re), Niobium (Nb), Ni, gold (Au), aluminum (Al), tantalum (Ta), molybdenum (Mo), NiSix, titanium silicide (TiSi), titanium nitride (TiN), WSiN, Pt and the like. Thus, the contacts 190 and/or 192 may contain an ohmic contact portion in direct contact with the epitaxial layer 120, or more generally, with the semiconductor layer structure 106. In some embodiments, the contacts 190 and/or 192 may be formed of a plurality of layers or metals.

Accordingly, wide bandgap field effect/bipolar transistor devices 100a, 100b in accordance with embodiments of the present invention include a frontside or top portion of the semiconductor layer structure 106 that may be similar to a planar MOSFET structure (shown in FIGS. 1A, 2A, and 3A) or trench MOSFET structure (shown in FIGS. 1B, 2B, and 3B), including a drift region 120 of a first conductivity type (e.g., n-type), source regions 160 of the first conductivity type, and well regions 140 of a second conductivity type (e.g., p-type).

Still referring to FIGS. 1A to 3B, a backside structure or bottom portion 110 of the semiconductor layer structure 106 of the wide bandgap field-effect/bipolar transistor devices 100a, 100b may be similar to an IGBT structure. The backside structure 110 may be a semiconductor layer (e.g., an SiC growth substrate or subsequently formed Si layer) provided between the drain contact 192 and the drift region 120. The backside structure 110 may be the same material as the drift region 120, or may be a different material that defines a heterojunction 120/110 with the wide bandgap semiconductor material of the drift region 120. The backside structure 110 includes an IGBT-like field-stop region 115 of the first conductivity type, a collector region 130 of the second conductivity type, and one or more drain gaps 115g of the first conductivity type in the collector region 130 adjacent the drain contact 192.

FIGS. 2A and 2B illustrate that the drain gap(s) 115g are configured to allow unipolar conduction 178u to the drain contact 192 positioned under the collector region 130 at current levels below the current density threshold $j_{th}$, with low resistance (Rds(on)) MOSFET operation during device turn-on and turn-off. The widths, density, and/or surrounding doping levels of the drain gap(s) 115g are configured to provide a current density threshold $j_{th}$, as further described with reference to the examples of FIGS. 5A to 6B. Unipolar conduction 178u of the majority carriers (shown by solid arrows) is thus provided between the source contact 190 and the drain contact 192 responsive to application of a voltage or control signal to the gate 184 at current levels below the current density threshold jth.

FIGS. 3A and 3B illustrate that a p-n junction between the field stop region 115 and the collector region 130 is configured to be forward-biased above the current density threshold jth to provide the bipolar conduction 178b. That is, after initial device turn-on and unipolar conduction as shown in FIGS. 2A and 2B, the current level may exceed the current density threshold jth. At this point, the p-n junction between the field stop region 115 and the collector region 130 conducts current with minority carriers, thus providing the bipolar conduction 178b (shown by dashed arrows) between the source contact 190 and the drain contact 192. When the current level falls below the current density threshold $j_{th}$, the minority carriers may be rapidly extinguished, e.g., due to the presence of the discrete minority carrier recombination sites 125, thus transitioning back to unipolar conduction 178u prior to device turn-off.

FIGS. 4A, 4B, 4C, 4D, 4E, 4F, and 4H are cross-sectional views illustrating example configurations of discrete minority carrier recombination sites in power semiconductor devices according to some embodiments of the present invention. The examples shown in FIGS. 4A to 4H are shown with reference to planar transistor devices (such as the unit cells 100a of FIGS. 1A, 2A, and 3A), but it will be understood that trenched transistor devices (such as the devices 100b of FIGS. 1B, 2B, and 3B) may be similarly formed.

As shown in FIGS. 4A to 4H, the discrete minority carrier recombination sites 125 may be formed in the conduction path in the drift region 120 between and spaced apart from the first and second surfaces 106f and 106b of the semiconductor layer structure 106. The recombination sites 125 may be formed with widths, depths, lateral spacings, doping concentrations, and/or density (number of recombination sites 125 per unit area) that may be adjusted or otherwise configured to provide desired or optimal minority carrier recombination for a given application.

For example, in some embodiments, the discrete recombination sites 125 may have respective widths (e.g., in the x-direction) from about 0.1 μm to about 1.0 μm, or even up to several microns (e.g., about 1 μm to about 5 μm), and respective thicknesses (e.g., in the z-direction) on the order of a few tenths of microns (e.g., about 0.1 μm to about 0.6 μm). The depths of the discrete recombination sites 125 (e.g., in the z-direction) may be between about 15% and about 85% of a thickness between the surfaces 106f and 106b, for example, about 50% of the thickness (i.e., in the middle of the drift region 120), about 33% of the thickness, or about 66% of the thickness of the drift region 120. As shown in FIGS. 4E-4G, discrete recombination sites 125 may be provided at multiple depths. Lateral spacings (e.g., in the x-direction) between adjacent discrete recombination sites 125 may be similar to the respective widths, for example, a few tenths of micron spacing (e.g., from about 0.1 μm to about 1.0 μm) up to several microns spacing (e.g., about 1 μm to about 5 μm), for example, spacings of about 0.2 μm to about 2.0 μm. The density of the discrete recombination sites 125 may range from 0 to several (e.g., about 1-3) per square micron.

As shown in FIGS. 4A to 4G, the discrete minority carrier recombination sites 125 may be implemented by plurality of doped regions of the first and/or second conductivity types 125n and/or 125p having a higher dopant concentration than the drift region 120. For example, doping concentrations of the p-type 125p and/or n-type 125n dopant regions may range from about $1 \times 10^{17}$ to about $5 \times 10^{20}$ atoms/cm³, e.g., about $5 \times 10^{17}$ to about $1 \times 10^{20}$ atoms/cm³. The p-type 125p and/or n-type 125n dopant regions may be introduced (e.g., by implanting dopants of the first and/or second conductivity types with a higher dopant concentration than the drift region) at various locations in the drift region 120.

Figure 4A:
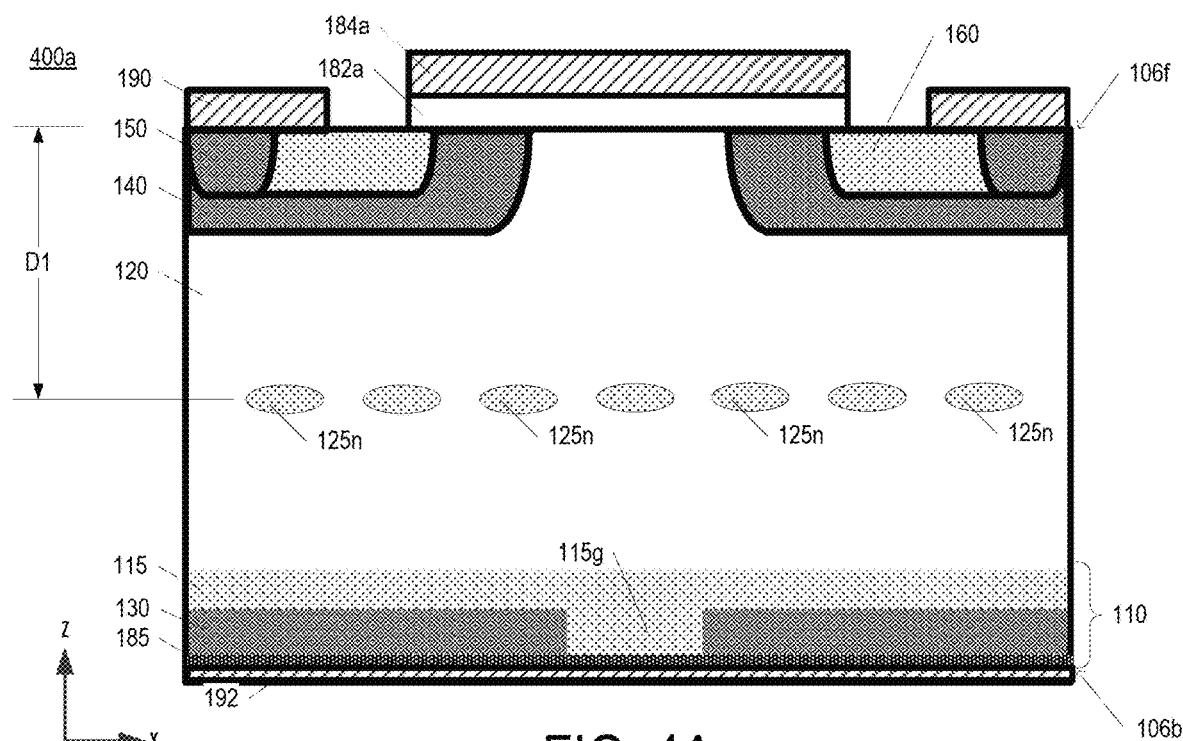
FIGS. 4A, 4B, 4C, 4D, 4E, 4F, and 4H are cross-sectional views illustrating example configurations of discrete minority carrier recombination sites in power semiconductor devices according to some embodiments of the present invention.
Figure 4B:
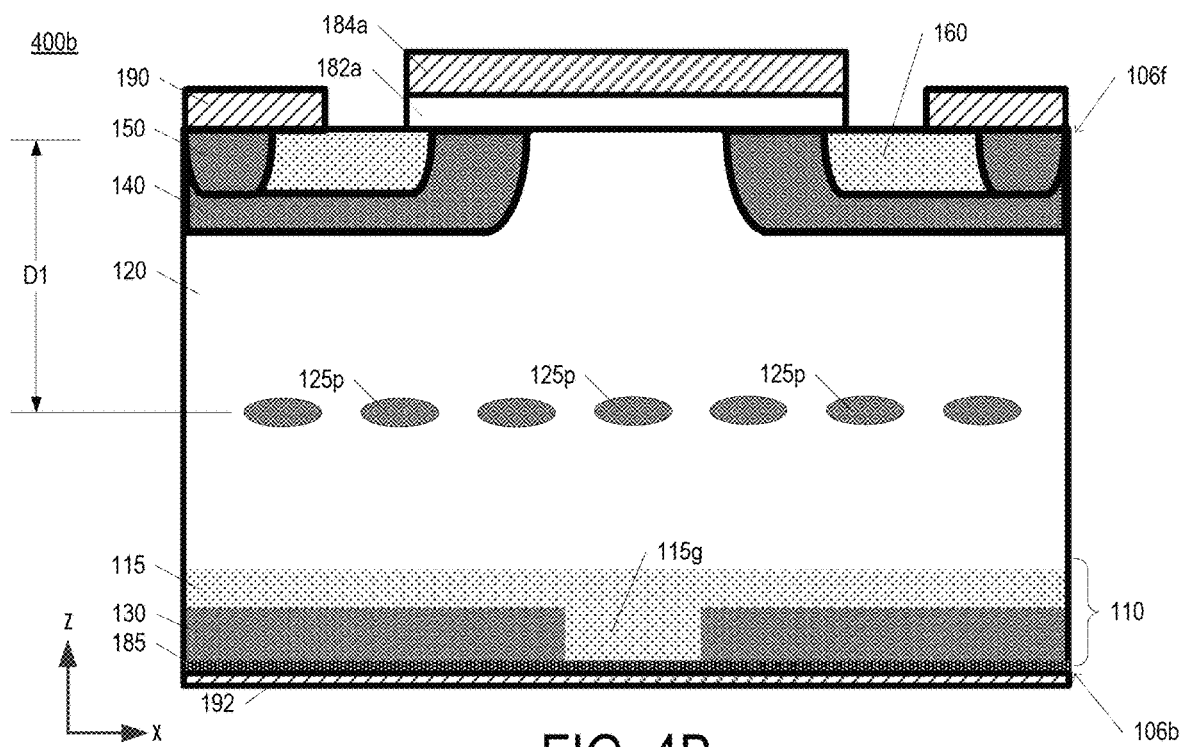
Figure 4C:
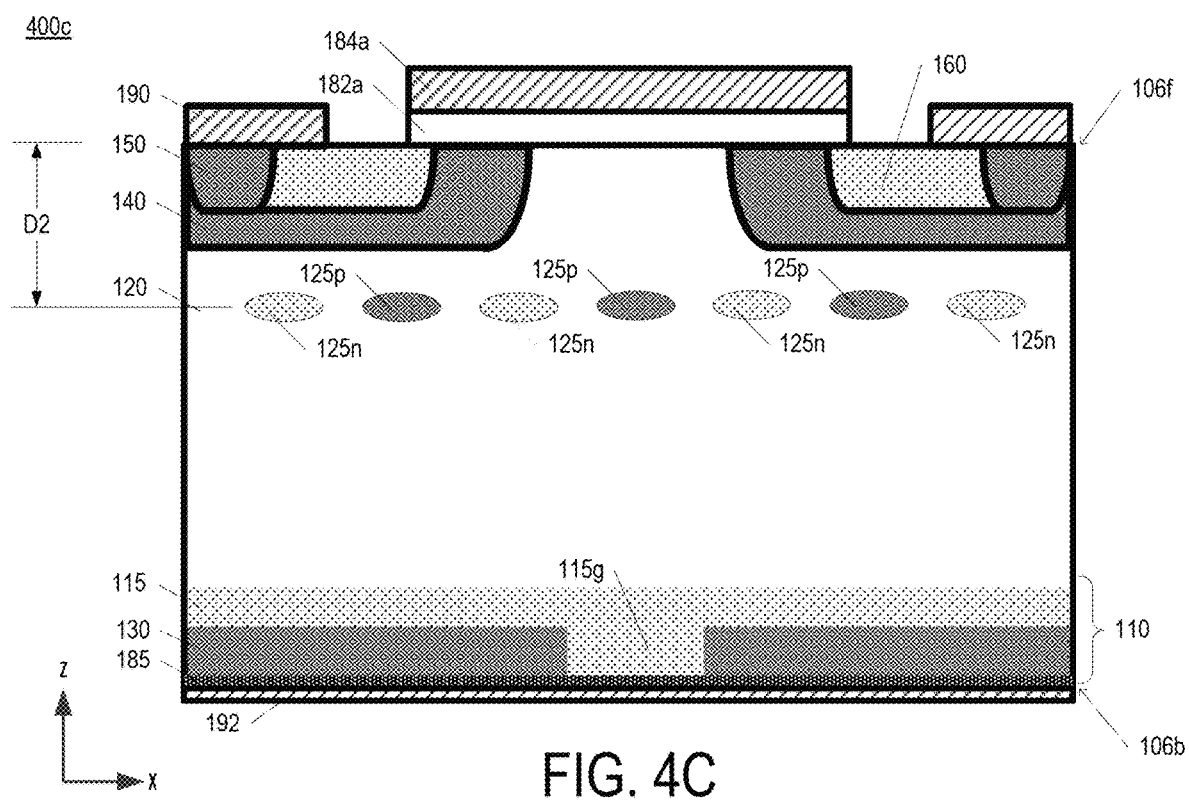
Figure 4D:
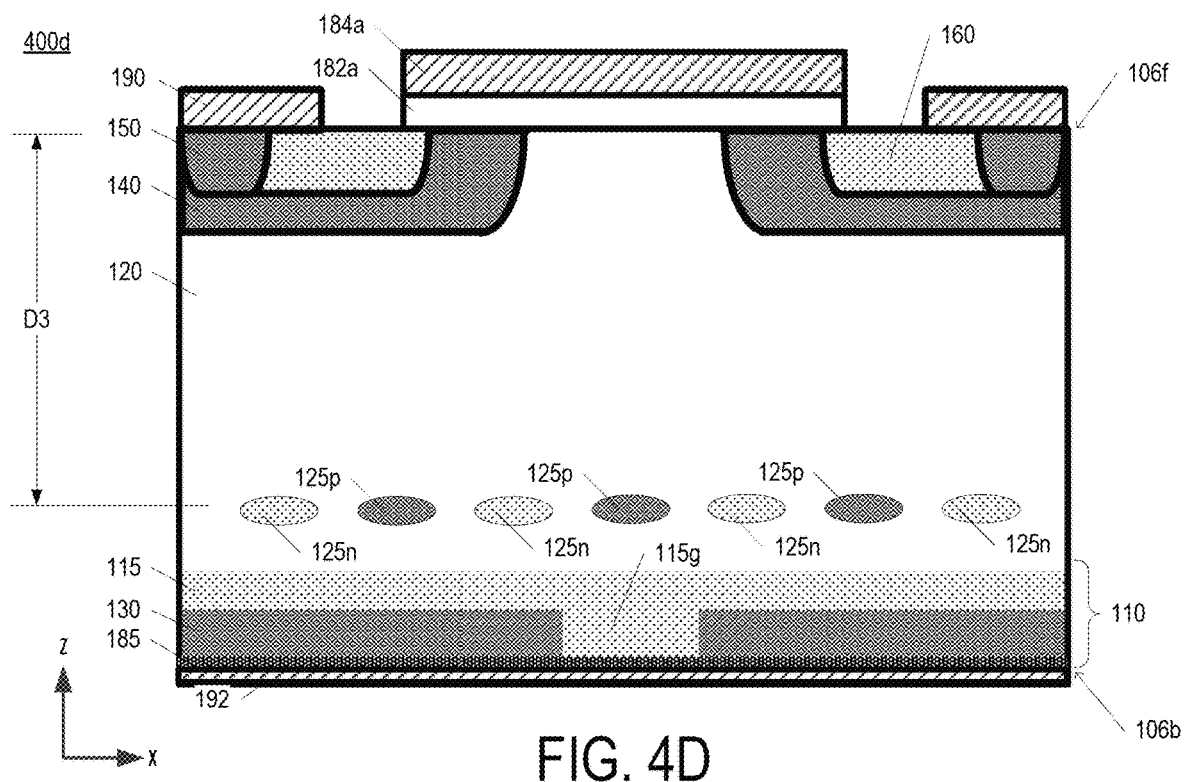
Figure 4E:
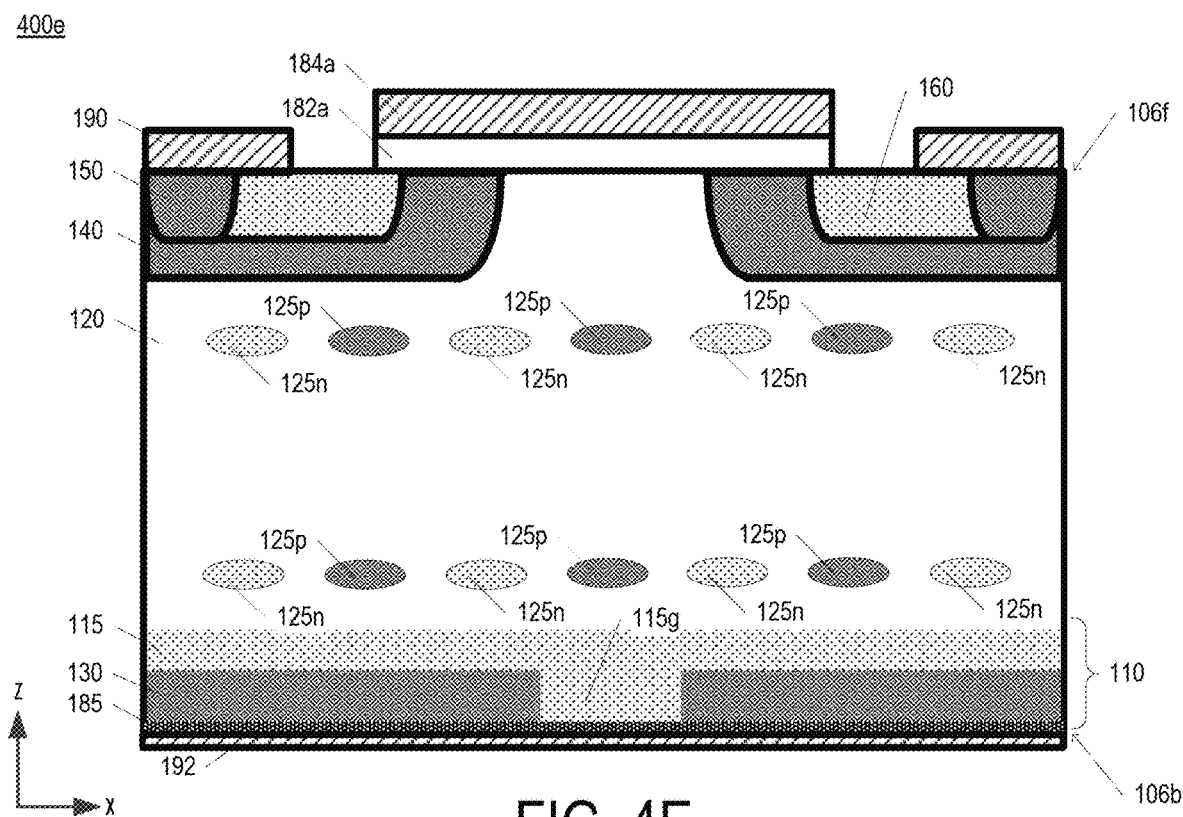
Figure 4F:
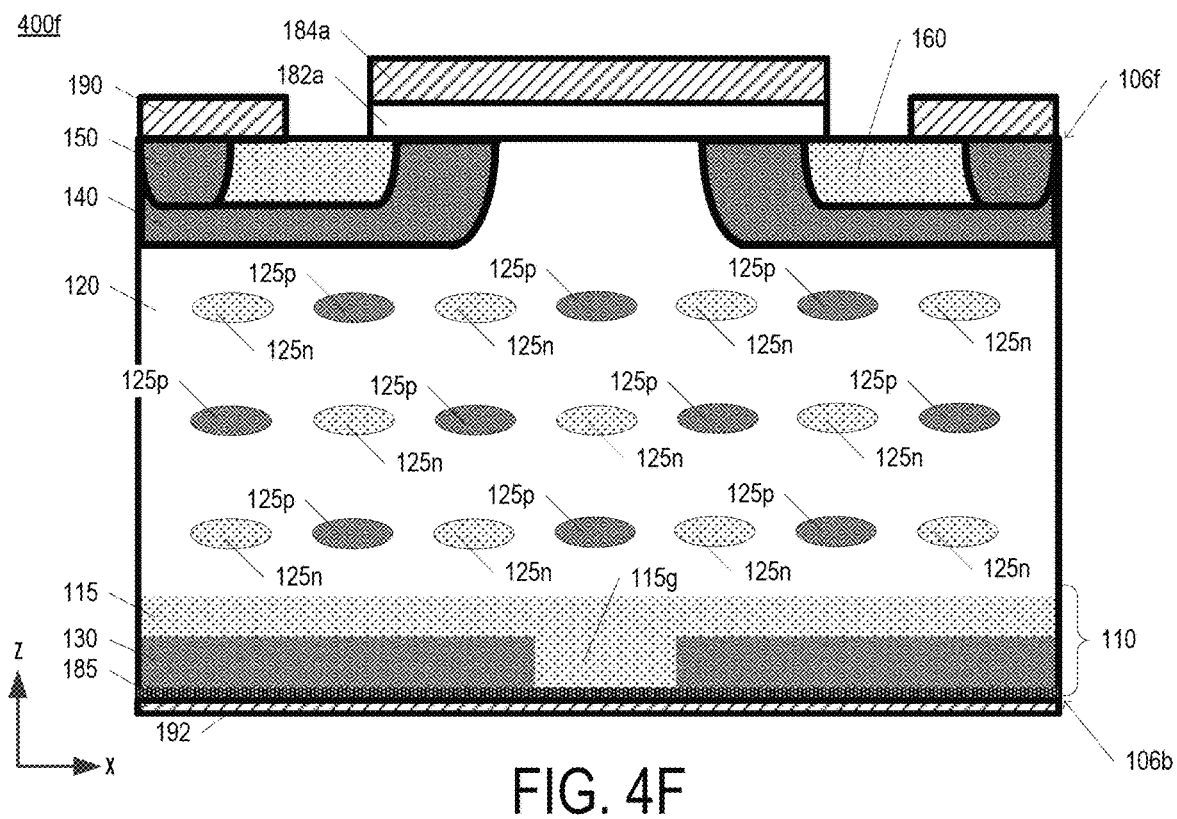
Figure 4G:
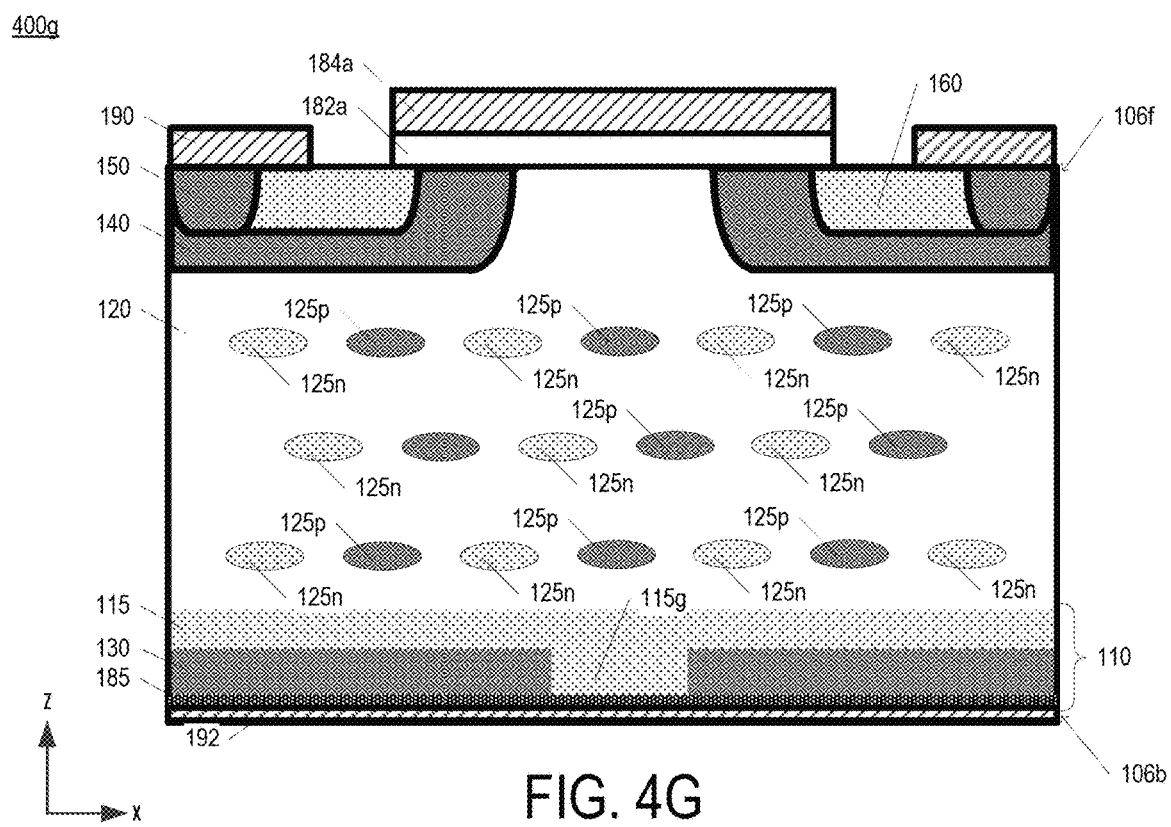

FIG. 4A illustrates an example device 400a where the discrete minority carrier recombination sites 125 are n-doped regions 125n. FIG. 4B illustrates an example device 400b where the discrete minority carrier recombination sites 125 are p-doped regions 125p. In FIGS. 4A and 4B, the discrete minority carrier recombination sites 125 are provided at respective depths D1 (relative to a front surface 106f) towards a middle portion of the drift region 120. Providing the discrete minority carrier recombination sites 125 in a central or middle portion of the drift region 120 (centrally located in the conduction paths) may be advantageous for carrier recombination efficiency. However, the discrete minority carrier recombination sites 125 may be provided closer to the front surface 106f (e.g., at a depth D2 as shown in the device 400c of FIG. 4C), closer to the back surface 106b (e.g., at a depth D3 as shown in the device 400d of FIG. 4D), or both (as shown in the device 400e FIG. 4E), which may be easier to implement from a fabrication process perspective (e.g., by implanting ions into the front surface 106f and/or into the back surface 106b). The depths D1, D2, D3 may be between about 15% to about 85% of a thickness defined between the first and second surfaces 106f and 106b of the semiconductor layer structure 106.

Also, the discrete minority carrier recombination sites 125 may be distributed throughout the drift region 120. For example, the device 400f of FIG. 4F illustrates a columnar distribution of the discrete minority carrier recombination sites 125 (e.g., with alternating n-doped regions 125n and p-doped regions 125p in each column). The device 400g FIG. 4G illustrates a staggered or offset distribution of the discrete minority carrier recombination sites 125 (e.g., with staggered rows of n-doped regions 125n and p-doped regions 125p).

Figure 4H:
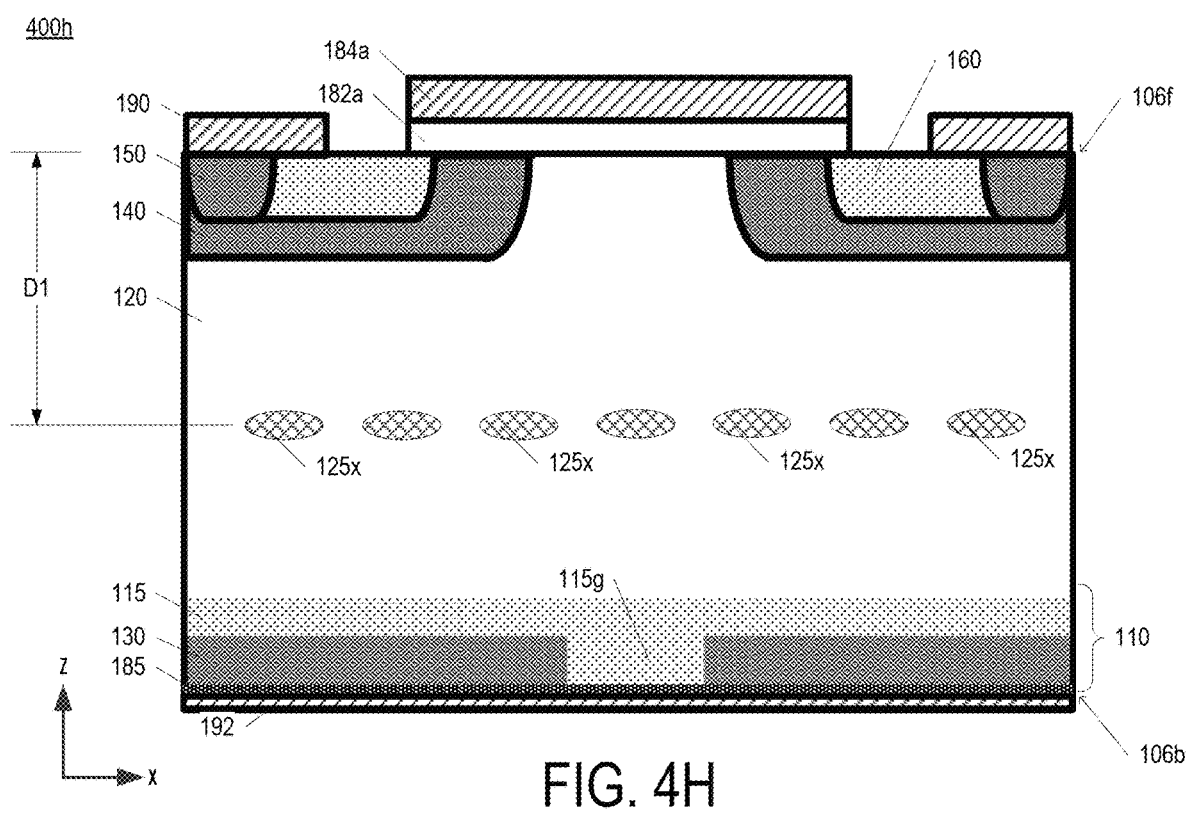
Figure 5A:
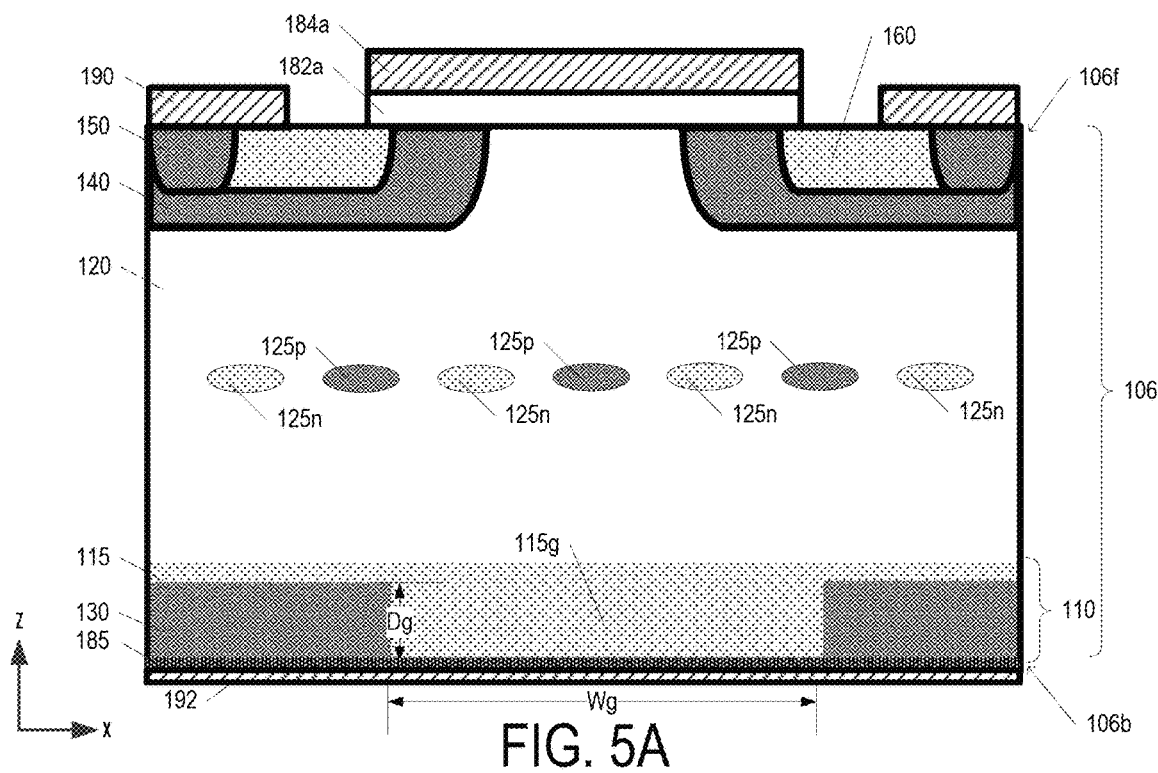
FIGS. 5A, 5B, 6A, and 6B are cross-sectional views illustrating example configurations of backside collector regions and drain gaps in power semiconductor devices according to some embodiments of the present invention.
Figure 5B:
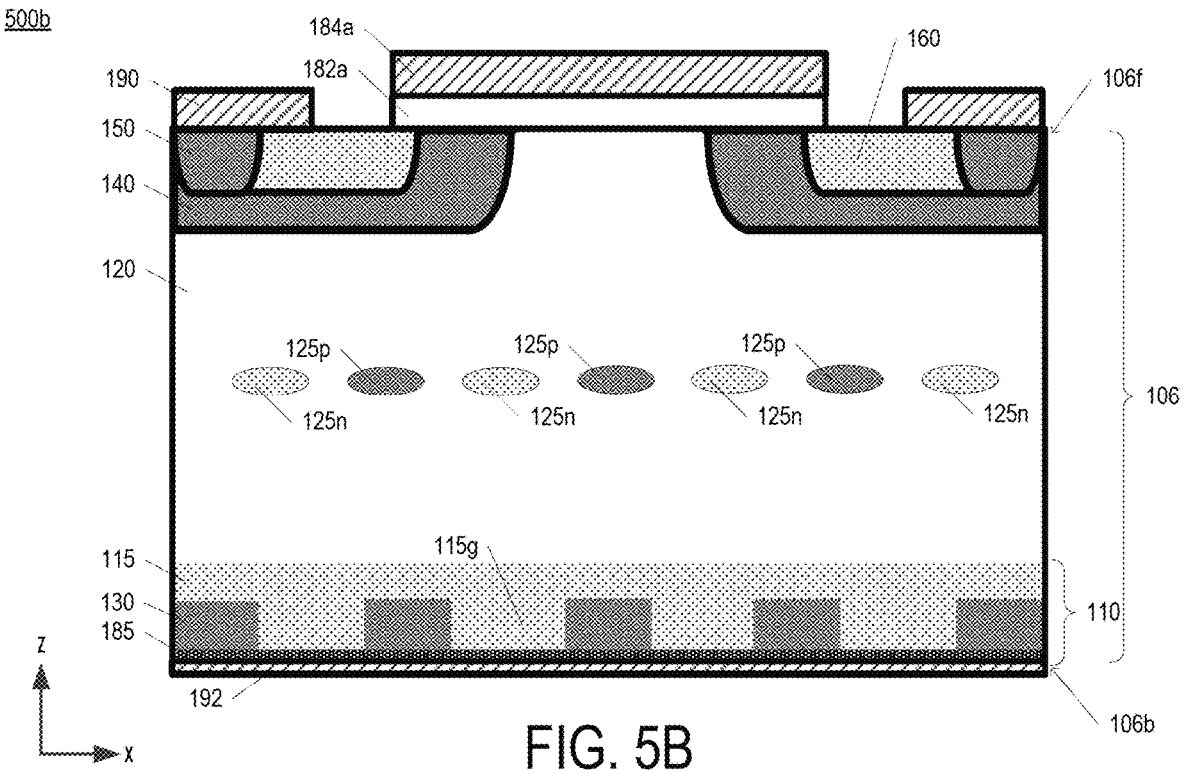
Figure 6A:
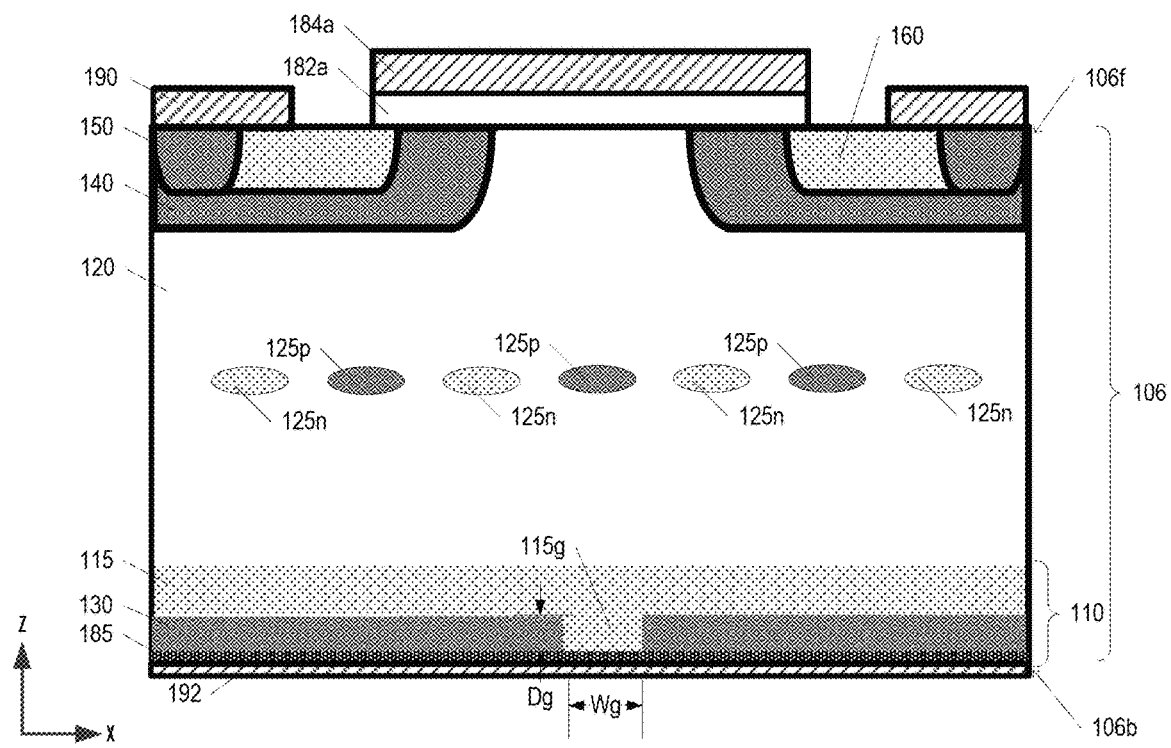
Figure 6B:
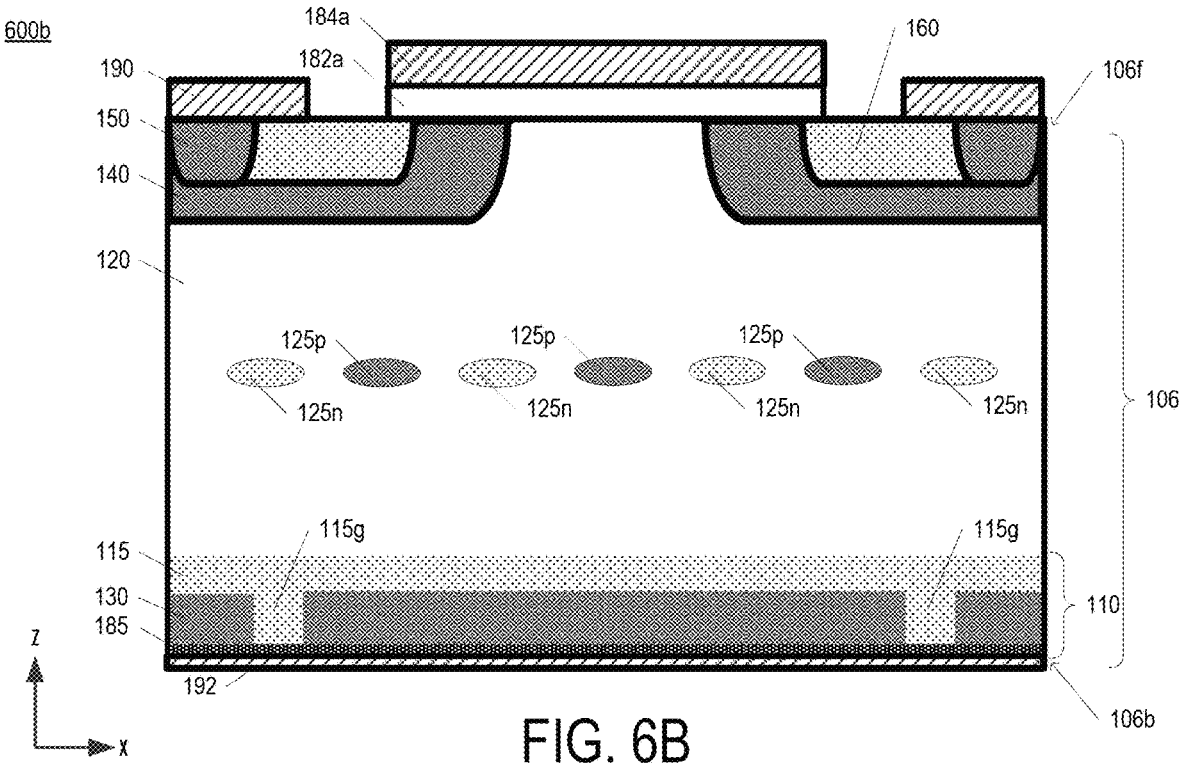

Additionally or alternatively, as shown in the device 400h of FIG. 4H, the discrete minority carrier recombination sites 125 may be implemented by forming defects 125x in a crystal lattice of the drift region 120. For example, a neutral ion species (such as argon (Ar) or hydrogen (H+)) may be implanted into the front 106f or back 106b surface of the semiconductor layer structure to break bonds or otherwise damage the crystal lattice of the drift region 120, creating the defects 125x. The defects 125x may thus include trace amounts of the neutral ion species, e.g., argon (Ar) and/ or hydrogen (H+). The defects 125x may be provided in the drift region 120 in any of the configurations and/or depths shown in FIGS. 4A to 4G.

More generally, the discrete minority carrier recombination sites 125 may include doped regions (with higher carrier concentrations than the drift region 120) and/or defects in the drift region 120 that are configured to aid minority carrier recombination. The discrete minority carrier recombination sites 125 may be provided in the drift region 120 in any desired ordered or random distribution between and spaced apart from the first and second surfaces 106f and 106b of the semiconductor layer structure to help minority carriers to recombine more quickly (and thus increase the switching speed of the device), with widths, depths, spacings, doping, and/or density that can be selected to balance the tradeoff between reducing turn-off speed and reducing on-resistance.

FIGS. 5A, 5B, 6A, and 6B are cross-sectional views illustrating example configurations of backside structures 110 including collector regions 130 and drain gaps 115 in power semiconductor devices according to some embodiments of the present invention. The examples shown in FIGS. 5A to 6B are shown with reference to planar transistor devices (such as the unit cells 100a of FIGS. 1A, 2A, and 3A), but it will be understood that trenched transistor devices (such as the devices 100b of FIGS. 1B, 2B, and 3B) may be similarly formed.

As shown in FIGS. 5A to 6B, the widths, doping levels, depths, and/or density (number of gaps 115g per unit area) of the gaps 115g may be adjusted or otherwise configured to provide a desired current density threshold $j_{th}$ at which the device switches from primarily unipolar to primarily bipolar operation, such that operation of the device is more MOS-FET-like or more IGBT-like. The current density threshold $j_{th}$ may refer to the current level which forward-biases the p-n junction between the collector region 130 and the field stop region 115, such that the IGBT turns on and becomes the dominant current-carrying mode (bipolar) of the mixed device. For example, the (lateral) width Wg and doping level of the drain gap(s) 115g, and the doping level and depth of the collector region 130 (which may define the depth Dg of the drain gap(s) 115g) into the backside 106b of the structure 106 may be configured such that, at current levels greater than the current density threshold $j_{th}$, the voltage drop between the collector nodes 130 and the surrounding opposite conductivity-type regions 115 is sufficient to cause the p-n junction between the collector region 130 and the field stop region 115 to forward-bias at a desired drain current level to initiate the bipolar conduction 178b.

The dopant concentration (e.g., about $1\times10^{14}$ to about $1\times10^{19}$ atoms/cm$^3$), density (per unit area) and dimensions Wg, Dg of the drain gap(s) 115g may thus be configured to provide different desired operational behavior. For example, increasing the dopant concentrations of the first conductivity type (e.g., in a range of about $5\times10^{16}$ to about $5\times10^{18}$ atoms/cm$^3$), increased widths Wg and/or depths Dg (as shown in the device 500a of FIG. 5A), and/or more drain gaps 115g (as shown in the device 500b of FIG. 5B) may provide a higher current density threshold $j_{th}$, delaying the transition from unipolar conduction to bipolar conduction such that the devices 500a, 500b have more FET-like behavior. Conversely, drain gap(s) 115g with lower dopant concentrations of the first conductivity type (e.g., in a range of about $5\times10^{14}$ to about $5\times10^{16}$ atoms/cm$^3$), reduced widths Wg and/or depths Dg (as shown in the device 600a of FIG. 6A), and/or a fewer drain gaps 115g (as shown in the device 600b of FIG. 6B) may provide a lower current density threshold $j_{th}$, resulting in an earlier transition from unipolar conduction to bipolar conduction such that the devices 600a, 600b have more BJT-like behavior.

In some embodiments, backside doping operations may be used to form the field stop region 115, collector region 130, and/or drain gap(s) 115g to provide the backside structure 110 with the desired configurations (e.g., widths, depths, dopant concentrations, gap density). Laser annealing techniques may be used to activate the implanted dopants. Example fabrication operations are described in greater detail below with reference to FIGS. 7A to 12.

FIGS. 7A, 7B, 8A, 8B, 9, 10, 11, and 12 are cross-sectional views illustrating intermediate fabrication operations in methods of fabricating power semiconductor devices according to some embodiments of the present invention. The example processes shown in FIGS. 7A-12 are illustrated with reference to fabrication of the planar transistor device 100a of FIGS. 1A, 2A, and 3A but it will be understood that the trenched transistor device 100b of FIGS. 1B, 2B, and 3B may be similarly formed. Operations for fabricating the contacts 190, 192 and gate structure 182/184 are omitted for ease of explanation.

Figure 7A:
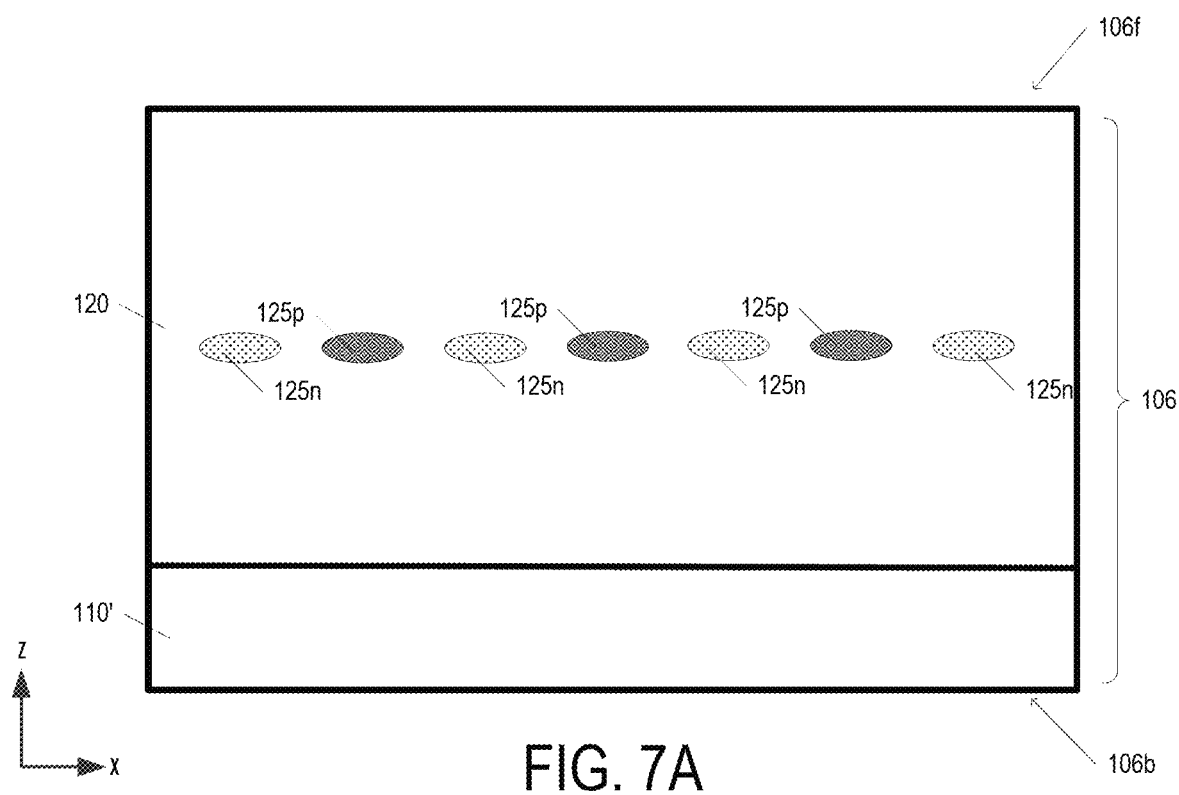
FIGS. 7A, 7B, 8A, 8B, 9, 10, 11, and 12 are cross-sectional views illustrating intermediate fabrication operations in methods of fabricating power semiconductor devices according to some embodiments of the present invention.
Figure 7B:
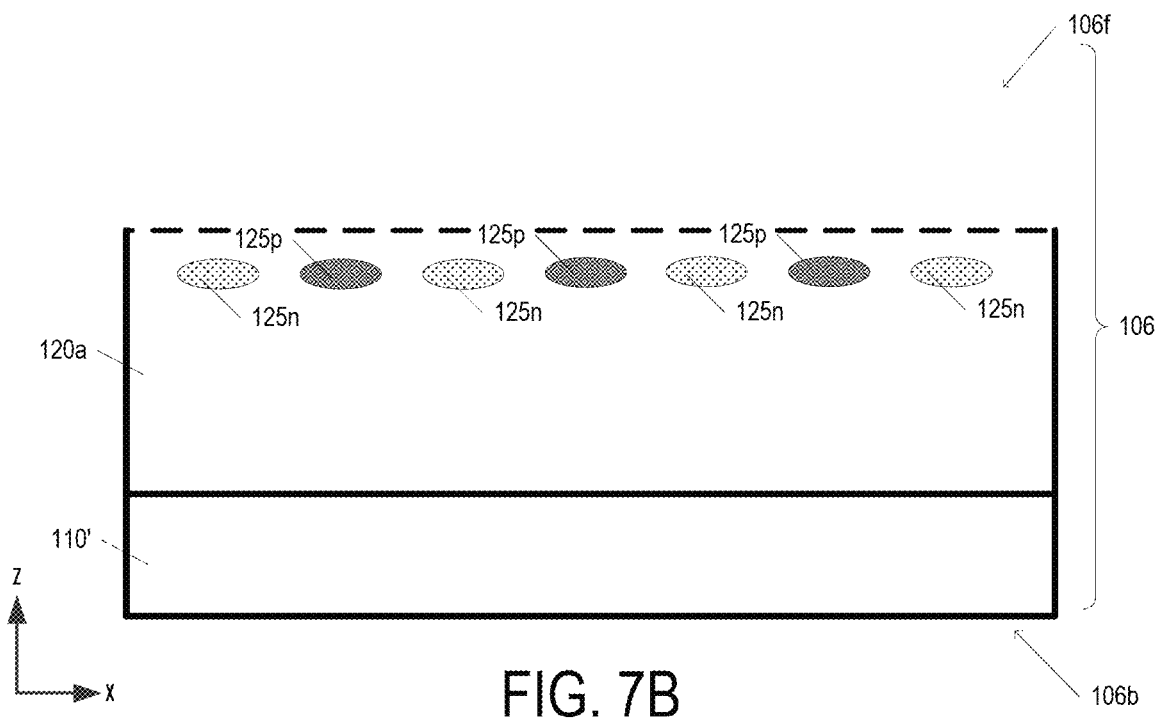

As shown in FIGS. 7A and 7B, a semiconductor layer structure 106 is formed by providing a drift region 120 of a first conductivity type on a substrate 110'. For example, the substrate 110' may be a silicon carbide substrate, and a lightly-doped (e.g., n) n-type drift layer or region 120 (e.g., a 4H-SiC epitaxial layer) may be epitaxially grown on the substrate 110'. The drift region 120 may include a concentration of dopants of the first conductivity type of greater than about $5\times10^{14}$ atoms/cm$^3$, for example, about $5\times10^{14}$ to $5\times10^{17}$ atoms/cm$^3$. A concentration of dopants of the second conductivity type (e.g., p-type) in the drift region 120 may be less than or otherwise substantially unequal to that of the first conductivity type, such that the drift region 120 may not be charge balanced.

Still referring to FIGS. 7A and 7B, a plurality of discrete minority carrier recombination sites (125n, 125p, and/or 125x; collectively 125) are formed in the drift region 120 so as to be spaced apart from opposing first and second surfaces 106f and 106b of the semiconductor layer structure 106. The discrete minority carrier recombination sites 125 may be formed by implanting ions into the drift region 120 from the front surface 106f and/or the back surface 106b of the semiconductor layer structure 106.

For example, as shown in FIG. 7A, an ion implantation process is performed to form the discrete minority carrier recombination sites 125 using a frontside implantation process, with one or more implantation energies selected to provide the discrete minority carrier recombination sites 125 at one or more depths over a thickness of the drift region 120. In another example, as shown in FIG. 7B, the ion implantation process is performed during a break between multiple epitaxial growth processes. In particular, epitaxial growth may be paused (indicated by the dashed line) after formation of a first portion 120a of the drift region, the ion implantation process may be performed by implanting ions into the front side 106f to form the discrete minority carrier recombination sites 125, and the epitaxial growth may be resumed to complete fabrication of the drift region 120. As yet another example, as described below with reference to FIG. 11, the growth substrate 110' may be removed and the ion implantation process may be performed by implanting ions into the backside 106b to form the discrete minority carrier recombination sites 125 using a backside implantation process.

The discrete minority carrier recombination sites 125 may thereby be formed in any of the configurations discussed above with reference to FIGS. 4A to 4H. That is, the widths, depths, spacings, dopings, and/or density of the discrete minority carrier recombination sites 125 may be formed using the above and/or other processes to provide minority carrier absorption as needed to achieve desired device characteristics (e.g., faster switching speeds by forming more recombination sites 125, or lower on-resistance by forming fewer recombination sites 125).

Figure 8A:
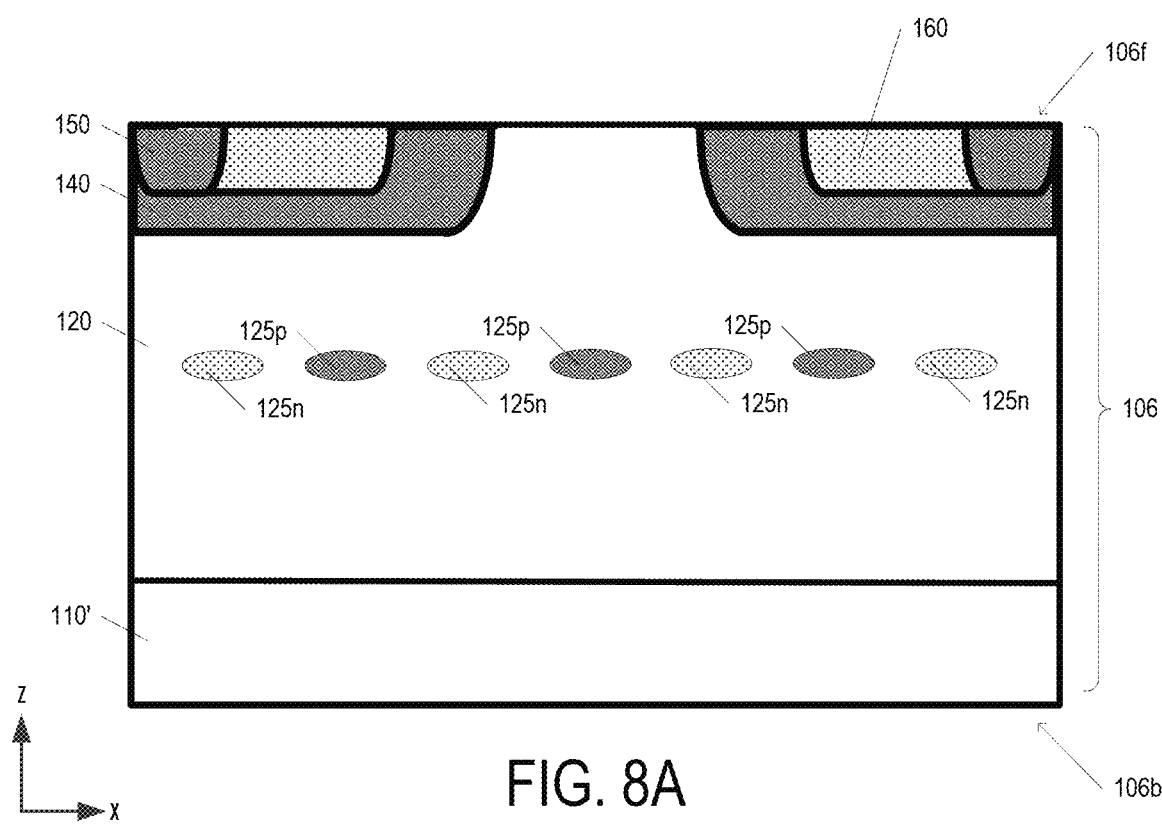
Figure 8B:
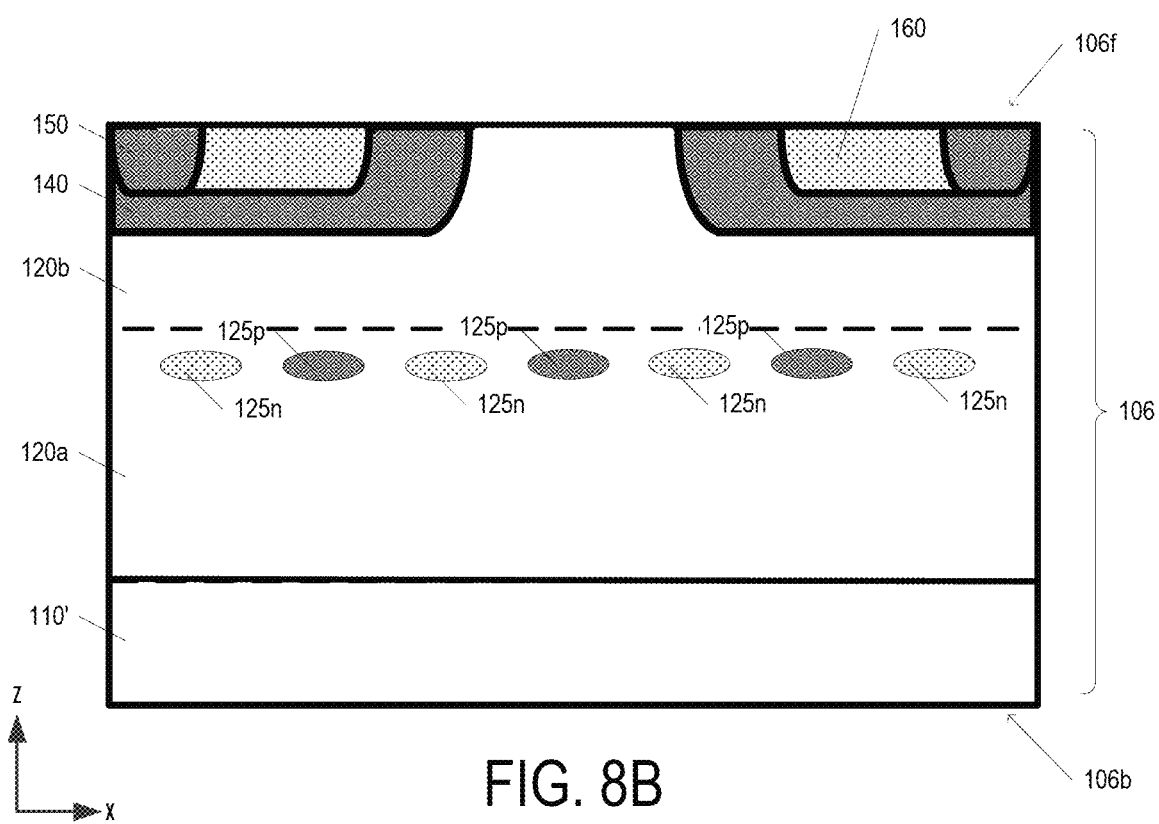

As shown in FIGS. 8A and 8B, one or more frontside processes (e.g., epitaxial growth, patterning, and/or ion implantation) may be performed to form moderately- or heavily-doped well regions 140 of the second conductivity type, heavily-doped source regions 160 of the first conductivity type (e.g., n+), and heavily-doped regions 150 of the second conductivity type (e.g., p+) adjacent the first surface 106f of the semiconductor layer structure 106. For example, using one or more masking or patterning operations, second conductivity-type dopants may be implanted into the front surface 106f to form the well regions 140, first conductivity-type dopants may be implanted into the front surface 106f to form the source regions 160 in upper portions of the well regions 140, and second conductivity-type dopants may be implanted into the front surface 106f to form the regions 150 in upper portions of the well regions 140 adjacent the source regions 160.

Figure 9:
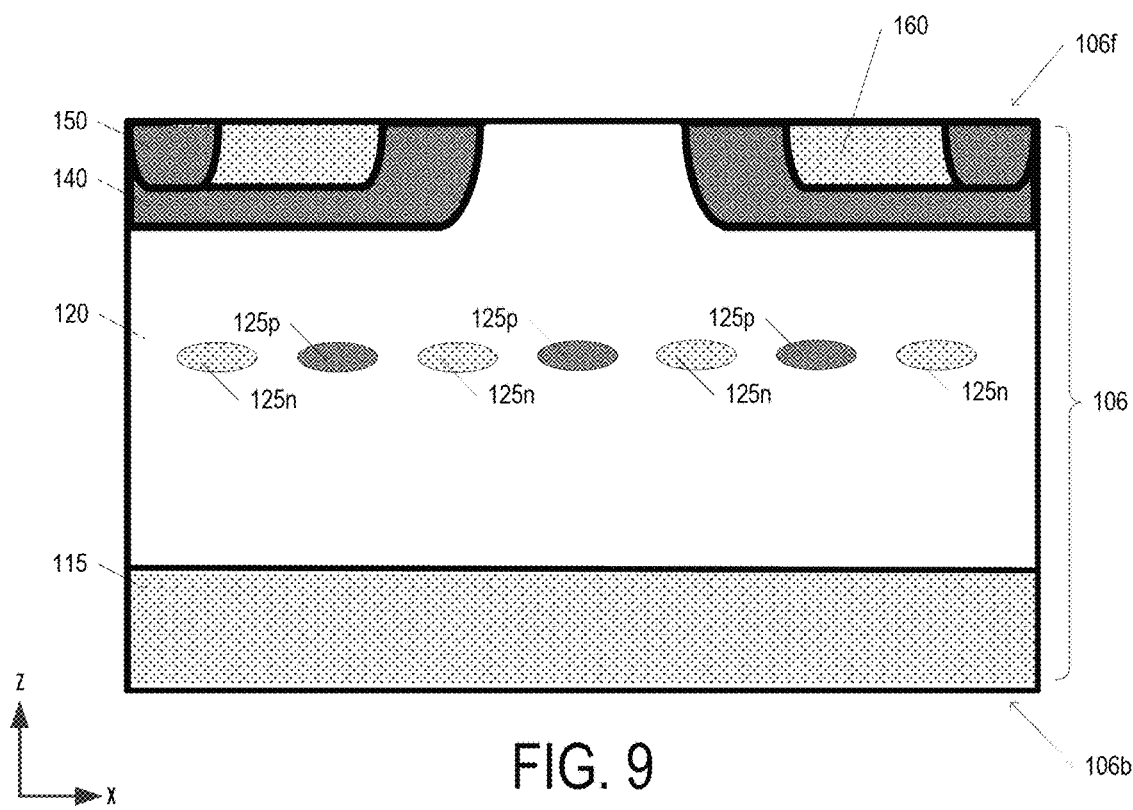
Figure 10:
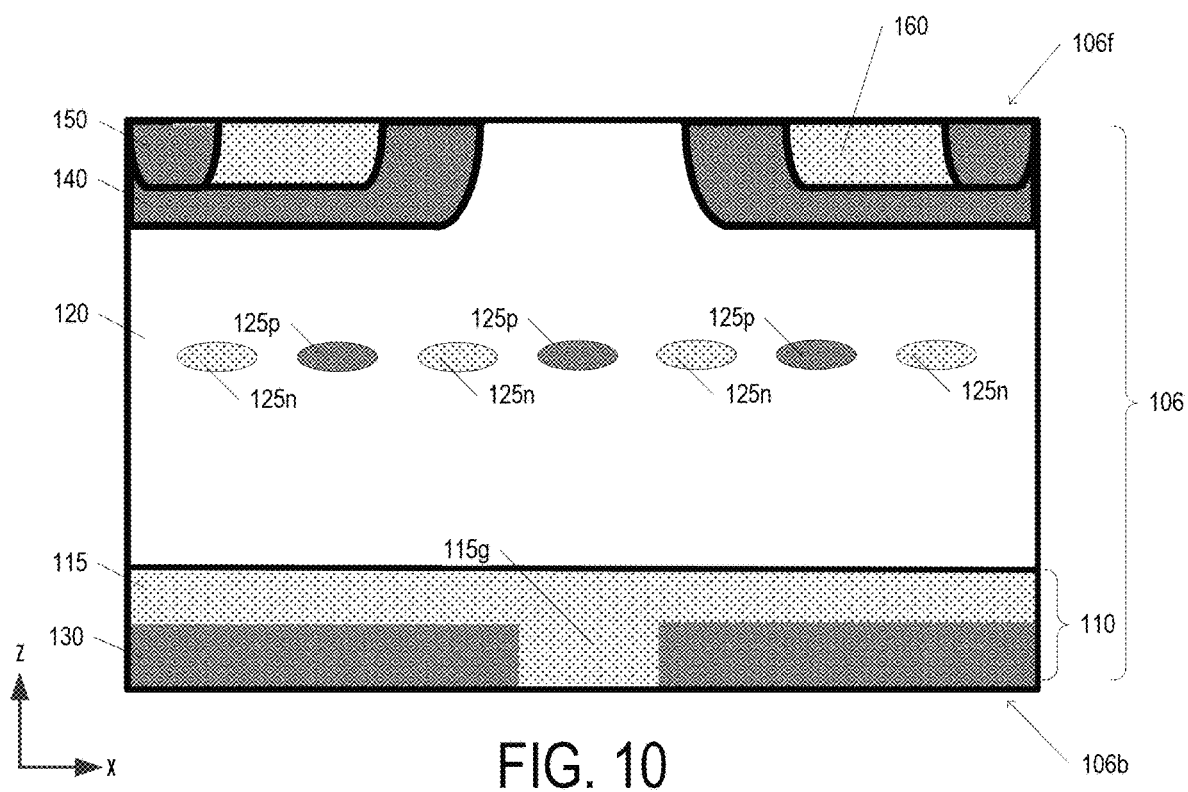

As shown in FIGS. 9 and 10, one or more backside processes (e.g., patterning, ion implantation, and/or annealing processes) may be performed to form a field stop region 115 of the first conductivity type, a collector region 130 of the second conductivity type, and at least one drain gap 115g of the first conductivity type adjacent the second surface 106b of the semiconductor layer structure 106, defining the backside structure 110. For example, a blanket ion implantation process may be performed to implant first conductivity-type dopants into the back surface 106b to form the field stop region 115 at a desired depth (relative to the back surface 106b), and a selective ion implantation process using one or more masking or patterning operations may be performed to implant second conductivity-type dopants into the back surface 106b to form the collector region 130 and the drain gap(s) 115g with the desired depths (relative to the back surface 106b), spacings, and/or dopant concentrations, which may differ from the field stop region 115. One or more annealing operations may also be performed, e.g., for implant activation. For example, the implants in the backside-doped regions (e.g., the collector region 130, the field stop region 115, and the drain gap(s) 115g) may be activated using laser annealing techniques.

The drain gap(s) 115g may thereby be formed in any of the configurations discussed above with reference to FIGS. 5A to 6B. That is, the widths, doping levels, depths, and/or density of the drain gap(s) 115g and/or the surrounding regions 115 and/or 130 may be formed using the above and/or other processes to define the current density threshold jth (at which the device switches from primarily unipolar to primarily bipolar conduction between source and drain contacts on opposing sides of a wide bandgap semiconductor drift layer) to achieve desired device characteristics (e.g., whether the device operates with more MOSFET-like or more IGBT-like behavior).

In some embodiments, relatively high temperatures (e.g., greater than about 1500 degrees Celsius) may be required for implant activation in WBG materials such as SiC, which may present fabrication complexities in order to avoid damaging or otherwise detrimentally affecting other components of the device. For example, one or more frontside components (such as the gate structure 182/184 and/or the source contacts 190) may be negatively affected by such higher implant activation temperatures. As such, the wafer backside p-n junctions 115/130/115g may be formed in one or more different semiconductor layers 110" that define a heterojunction 110/120 with the wide bandgap semiconductor material of the drift region 120, such that the implants may be activated at lower temperatures.

Figure 11:
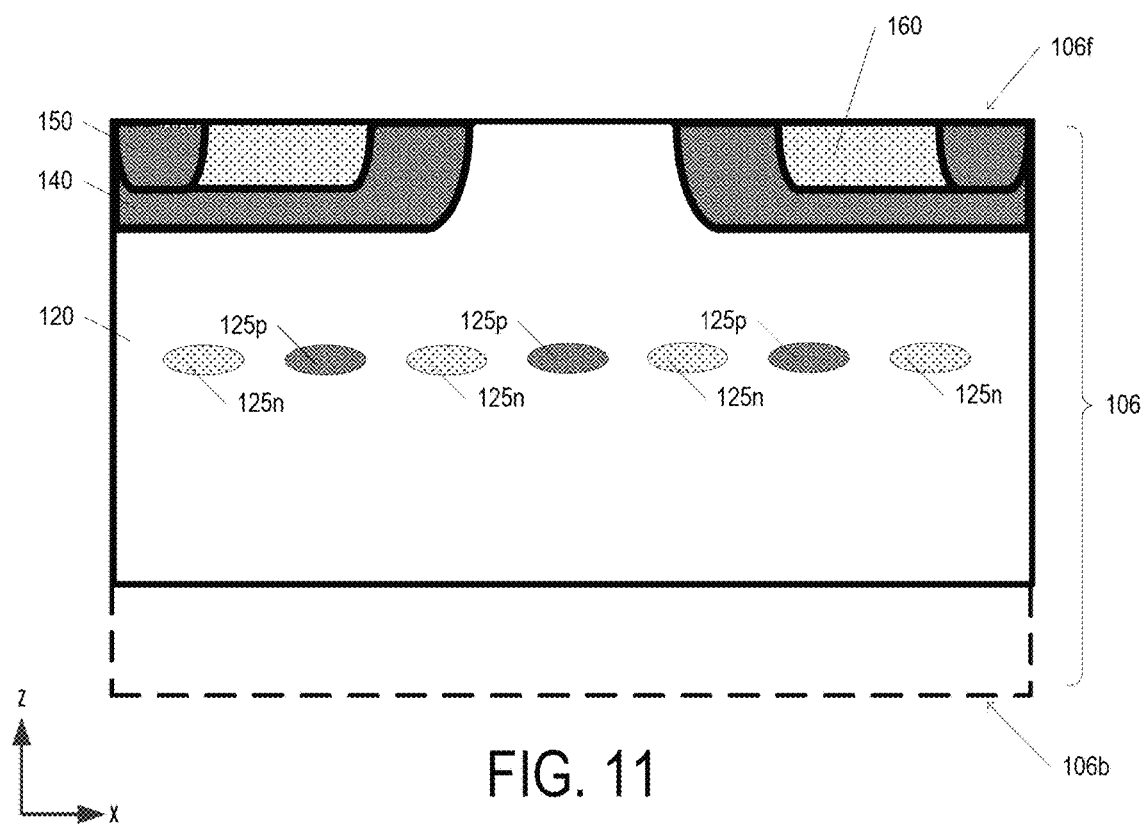
Figure 12:
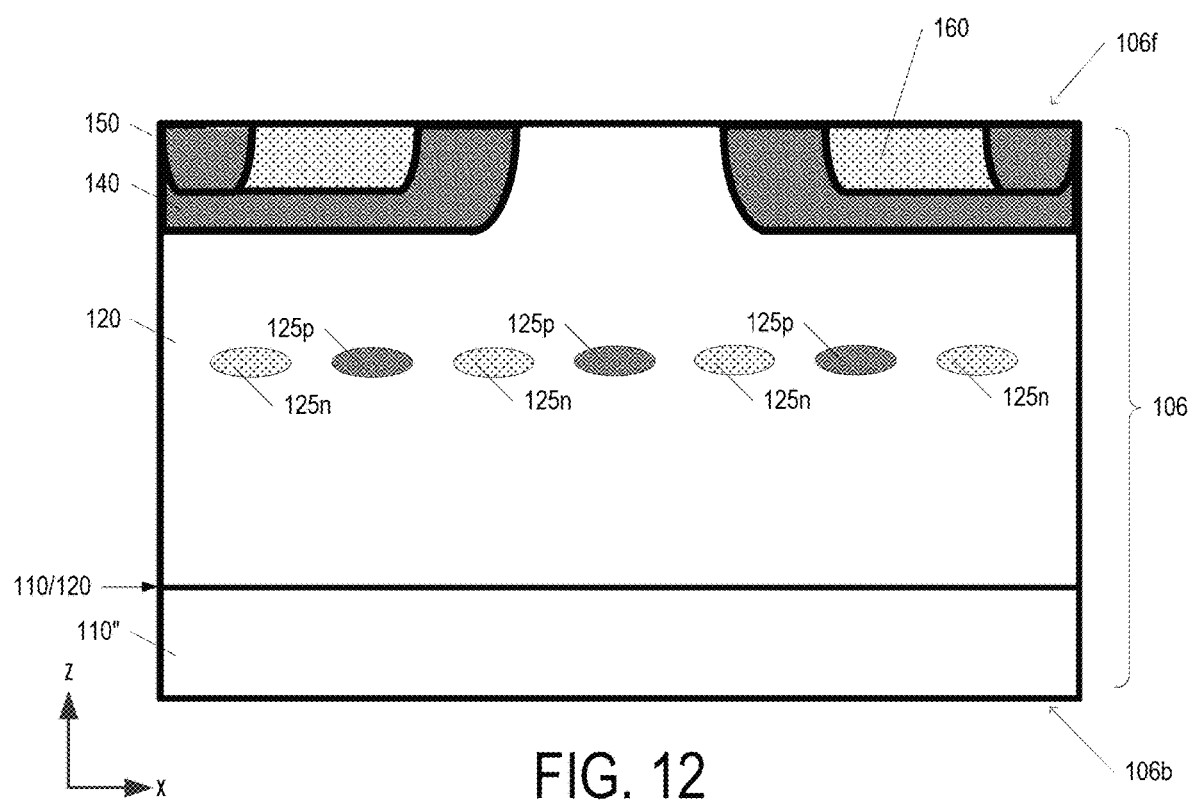

For example, as shown in FIG. 11, the substrate 110' may be removed from the back surface 106b of the semiconductor layer structure 106 to expose a surface of the drift region 120, e.g., using wafer backgrinding. As shown in FIG. 12, a layer 110" of a different semiconductor material (e.g., Si) than the drift region 120 may be formed on the exposed surface of the drift region 120 to define the heterojunction 110/120 between the semiconductor layer 110" and the drift region 120. In some embodiments, the semiconductor layer 110" is an amorphous Si layer that is formed on the backside of a SiC drift region 120, after removal of the SiC substrate 110'.

In some embodiments, the semiconductor layer 110" can be patterned and implanted as described with reference to FIGS. 9 and 10 to form the field stop region 115, the collector region 130, and the drain gap(s) 115g in the semiconductor layer 110" to define the backside structure 110. A backside annealing technique, such as laser annealing, may be performed on the backside structure 110 to activate the dopants and/or recrystallize the deposited semiconductor (e.g., Si) layer, for example, at comparatively lower temperatures than in SiC (e.g., less than about 900 degrees Celsius).

In some embodiments, the semiconductor layer 110" of the different semiconductor material (e.g., Si) may be deposited on the exposed surface of the drift region 120 to define the heterojunction 110/120 between the semiconductor layer 110" and the drift region 120 by sputtering from one or more sputter targets having a desired (or "built-in") doping. For example, a first silicon sputter target may be provided with a doping level appropriate for achieving or otherwise corresponding to the desired dopant concentration of the field stop region 115. The first silicon sputter target may be sputtered to the desired thickness for the field stop region 115. A second target may be provided with a second doping level appropriate for achieving or otherwise corresponding to the desired dopant concentration of the drain gap(s) 115g, and may be sputtered to the desired thickness for the drain gap(s)115g. The collector regions 130 may be formed using one or more photolithography and implant processes, and the drain region 185 may be subsequently implanted to define the backside structure 110. Laser annealing may be used to crystallize the backside structure 110 and activate the doping regions 115, 115g, 130, 185. In embodiments where the semiconductor layer 110" is sputtered in multiple passes, the laser annealing may be performed multiple times, e.g., once after each sputter deposition, to help achieve better crystallization and dopant incorporation in each layer or region 115, 115g of the backside structure 110.

Some embodiments of the present invention may thus involve significant backside processing, which may be beyond that typically used in fabricating MOSFETs or IGBTs. Thin wafer handling techniques may be used when performing such backside photolithography patterning, blanket and masked implantation, and backside annealing.

FIGS. 13A, 13B, 14A, and 14B are plan or layout views (e.g., along the X- and Y-directions) of a power semiconductor device or die illustrating example configurations of backside structures 110 (including example configurations 110p, 110p', 110c, and 110c') including collector regions 130 and drain gaps 115g according to some embodiments of the present invention, integrated with traditional MOSFETs in the same die. The device includes a plurality of individual unit cell structures 100 electrically connected in parallel in an array 1000. The drain contact 192 is not shown in FIGS. 13 and 14 for ease of illustration of the underlying backside structure 110.

As described above, the local configurations (e.g., at the unit cell 100 level) of the drain gaps 115g and/or the discrete minority carrier recombination sites 125 can be selected to provide desired operating characteristics, including the current density threshold jth for the transition from unipolar to bipolar conduction, and the on- and off-switching speeds. For example, wider and/or more drain gaps 115g may result in more MOSFET-like behavior, while narrower and/or fewer drain gaps 115g may result in more IGBT-like behavior. Also, more minority carrier recombination sites 125 may result in faster switching speeds, while fewer minority carrier recombination sites 125 may result in lower on-resistance.

Figure 13A:
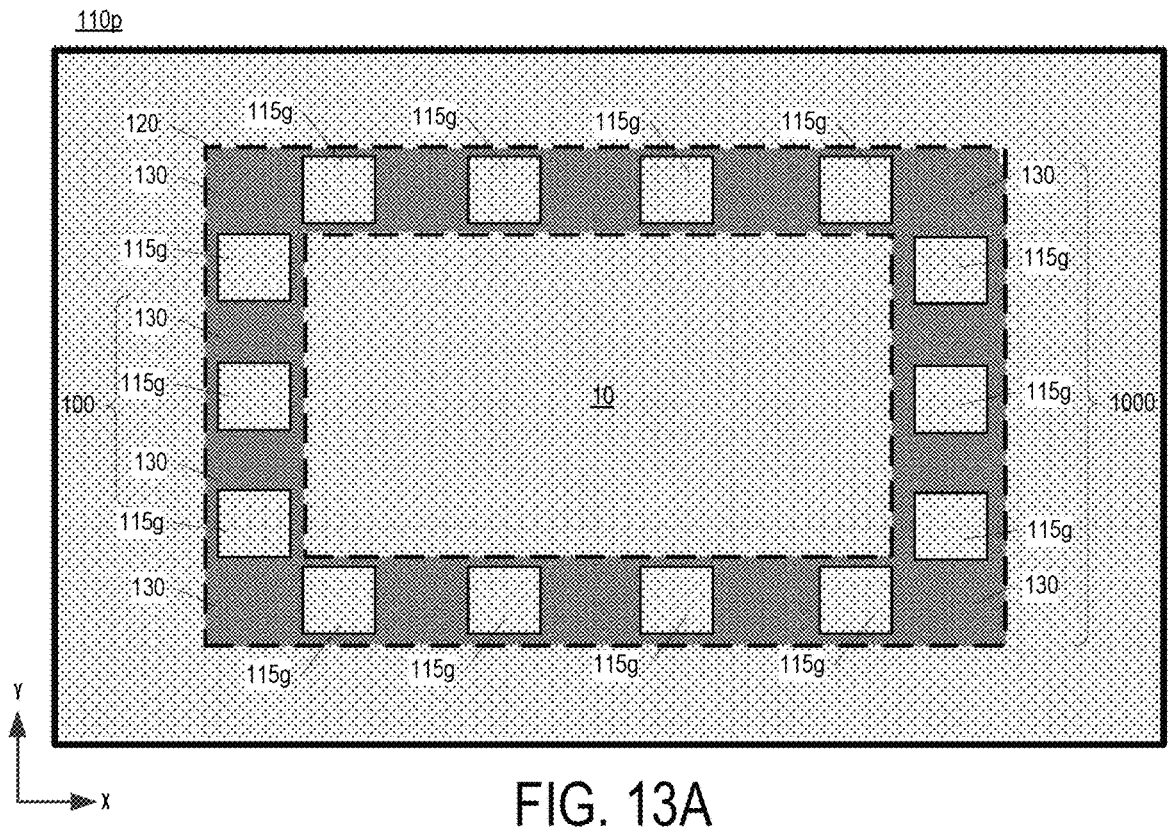
FIGS. 13A, 13B, 14A, and 14B are plan or layout views of a semiconductor device or die illustrating example configurations of backside structures including collector regions and drain gaps according to some embodiments of the present invention.
Figure 13B:
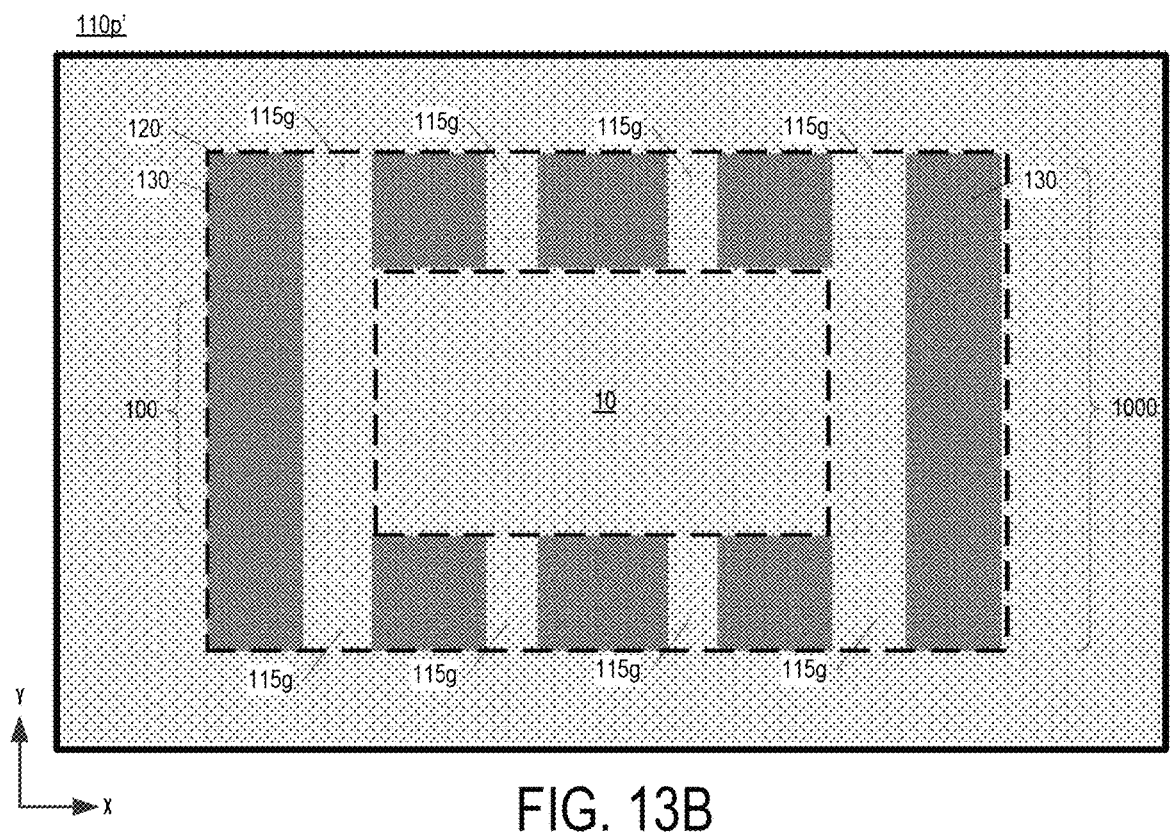

In addition, global configurations (e.g., at the device or array 1000 level) of field effect/bipolar power devices according to embodiments of the present invention may also be varied to provide desired operating characteristics. In particular, FIGS. 13A and 13B illustrate example layout configurations 110$p$ and 110$p'$ that implement traditional MOSFETs 10 in a central region of the array 1000, with field effect/bipolar transistor devices 100 (e.g., MOS-IGBTs; also referred to herein as MOSBIPs) in a peripheral region or perimeter of the array 1000. The backside structure layout configurations 110$p$, 110$p'$ of FIGS. 13A and 13B may provide improved heat dissipation in comparison to implementing the MOS-IGBTs 100 in the central region of the array 100. However, the backside structure layout configurations 110$p$, 110$p'$ may provide increased heat in the termination region implemented at the periphery of the array 1000. In some embodiments, a heat sink may be implemented on the backside structure 110 to improve heat distribution.

Figure 14A:
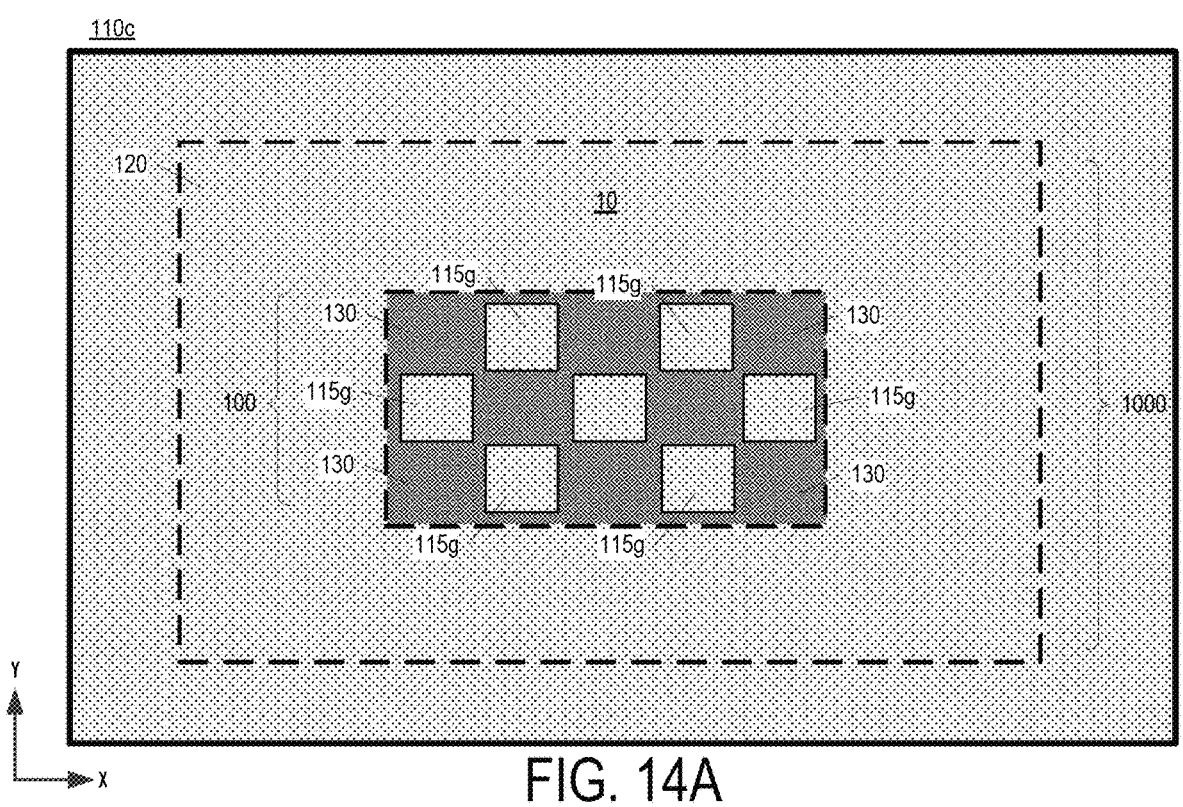
Figure 14B:
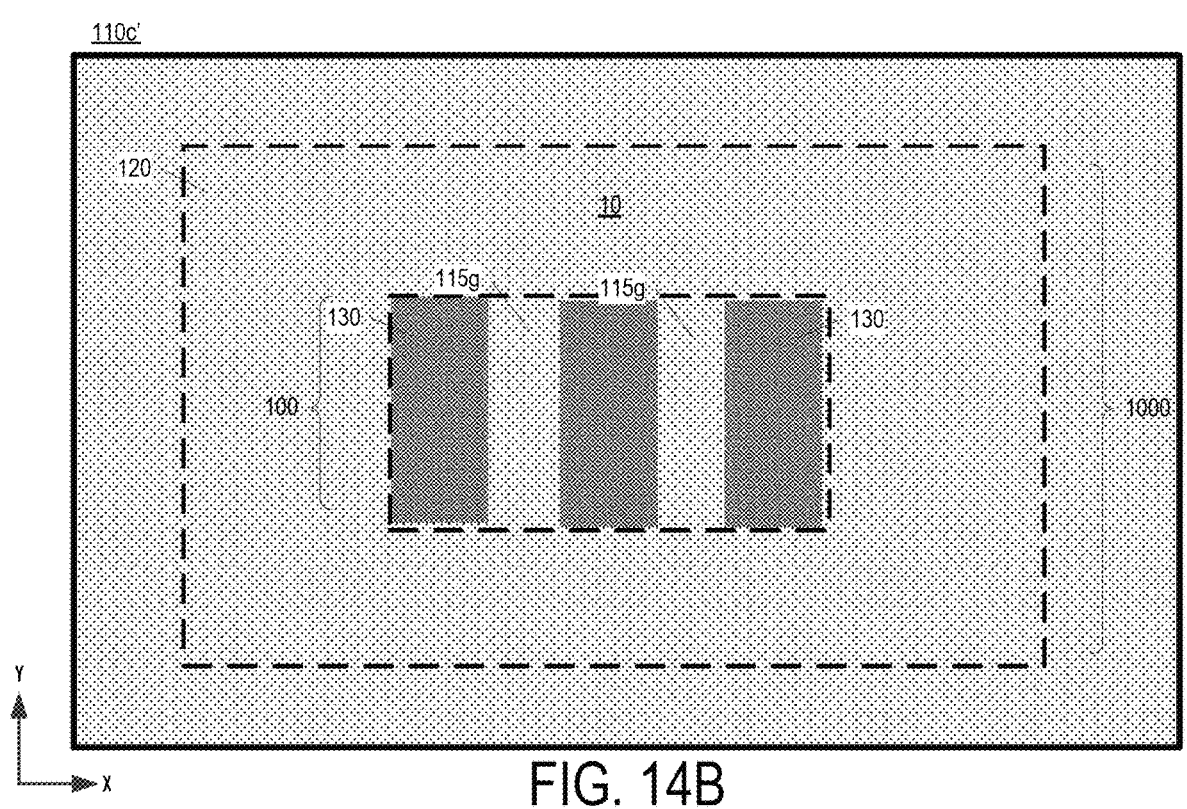

Alternatively, FIGS. 14A and 14B illustrate example layout configurations 110$c$, 110$c'$ that implement traditional MOSFETs 10 in a peripheral region or perimeter of the array 1000, with field effect/bipolar transistor devices 100 in the central region of the array 1000. The backside structure layout configurations 110$c$, 110$c'$ of FIGS. 14A and 14B may limit stray bipolar carriers from extended decay in the device termination region. In some embodiments, the backside structure layout configurations 110$c$, 110$c'$ may provide improved overall heat dissipation, and may reduce or avoid heating of the termination region, in comparison to the layout configurations 110$p$, 110$p'$.

In FIGS. 13A, and 14A, the drain gaps 115$g$ are surrounded on multiple sides by the collector region 130, so to allow improved control of the unipolar to bipolar transition. While illustrated as square-shaped in plan view in FIGS. 13A, 14A, it will be understood that the drain gaps 115$g$ may be defined by rectangles, hexagons, octagons, or other multi-sided or elliptical shapes in plan view, and may be matched to the pattern(s) of the corresponding topside cells (i.e., at the front surface 106$f$). In FIGS. 13B and 14B, the collector region 130 is implemented as continuous stripes, with the drain gaps 115$g$ as spaces between the stripes of the collector region 130. It will be understood that the implementations of FIGS. 13A to 14B are illustrated by way of example only, and that variations and/or other implementations of the collector regions 130 and drain gaps 115$g$ may be provided to allow unipolar conduction below a current density threshold, and bipolar conduction above the current density threshold in accordance with embodiments described herein.

Embodiments of the present disclosure may include several advantages over conventional devices. For example, while some conventional devices (such as Reverse-Conducting IGBTs) may include n-type gaps in a p+ collector region, the n-type gaps may not be configured for MOSFET operation, since the n-type drift region doping of a typical IGBT or RC-IGBT may be too low in concentration to support MOSFET/unipolar/majority-carrier operation with low on resistance ($R_{ds}On$). The n-type gaps in the p+ collector region of a RC-IGBT may instead only be supportive of diode operation in the reverse-conducting mode, with such diode operation being an example of minority carrier conduction, like the forward-conducting mode of an IGBT. In other words, a conventional RC-IGBT may not provide a unipolar operating mode. In contrast to an IGBT or a Reverse-Conducting IGBT, embodiments of the present invention may include a drift region 120 that is epitaxially deposited with a doping level appropriate for a MOSFET, i.e., a higher doping level than would typically be used within the typically low-doped drift region of an IGBT.

Also, while some conventional devices may provide MOSFET to IGBT operating mode transition, such devices typically require superjunction (charge-balanced) MOSFETs, where the drift region has multiple columns of one conductivity type, with substantially equal doping as the surrounding regions of the opposite conductivity type so as to cancel the charge in the surrounding regions under reverse bias. In contrast, embodiments of the present invention may not require charge-balanced junctions, for example, as the superior critical electric field provided by WBG materials (such as SiC) may allow for relatively thin (and lower resistance) drift regions even when supporting higher voltage operation. The drift region may also be "broken" at one or more intermediate locations, for fabrication of the discrete minority carrier recombination sites described herein. The discrete minority carrier recombination sites may allow for faster switching speeds without substantially increasing the on-resistance per unit area. Because power semiconductor device structures as described herein can switch from unipolar (e.g., MOSFET) mode to bipolar mode (e.g., IGBT) when high current flow is demanded, embodiments of the present invention can supply the burst current requirements of many switching applications without the extremely high operating temperature requirements that may otherwise be required of a unipolar-only device.

Embodiments of the present invention may thus provide transistor structures with faster switching speeds and more uniform current distribution (i.e., due to more of the transistor cells being switched on within a desired switching timeframe), that is, with advantages of both field-effect/voltage-controlled and bipolar/current-controlled devices. More uniform current distribution may also provide less local transistor cell aging (due to reduction of hot spots) and thus overall longer device lifetime. Embodiments of the present invention may be used in power devices, including vertical or lateral power devices, with n-type and p-type contacts to SiC or other wide bandgap semiconductor contact regions.

It will be appreciated that features of the different embodiments disclosed herein may be combined in any way to provide many additional embodiments. Thus, it will be appreciated that various features of the inventive concepts are described herein with respect to specific examples, but that these features may be added to other embodiments and/or used in place of example features of other embodiments to provide many additional embodiments. The present invention should therefore be understood to encompass these different combinations.

In the description above, each example embodiment is described with reference to regions of particular conductivity types. It will be appreciated that opposite conductivity type devices may be formed by simply reversing the conductivity of the n-type and p-type layers in each of the above embodiments. Thus, it will be appreciated that the present invention covers both n-channel and p-channel devices for each different device structure.

The present invention has primarily been discussed above with respect to silicon carbide based power semiconductor devices. It will be appreciated, however, that silicon carbide is used herein as an example and that the devices discussed herein may be formed in any appropriate wide bandgap semiconductor material system. As an example, gallium nitride based semiconductor materials (e.g., gallium nitride, aluminum gallium nitride, etc.) may be used instead of silicon carbide in any of the embodiments described above. More generally, while discussed with reference to silicon carbide devices, embodiments of the present invention are not so limited, and may have applicability to devices formed using other wide bandgap semiconductor materials, for example, gallium nitride, zinc selenide, or any other II-VI or III-V wide bandgap compound semiconductor materials.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

Herein, a first element (e.g., a contact, layer or region) of a semiconductor device "vertically overlaps" a second element of the semiconductor device if an axis that is perpendicular to a major surface of the semiconductor layer structure of the device (i.e., in a vertical direction) extends through both the first element and the second element.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Embodiments of the invention are also described with reference to fabrication operations. It will be appreciated that the steps shown in the fabrication operations need not be performed in the order shown.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A power semiconductor device, comprising:
a semiconductor layer structure comprising a drift region of a first conductivity type; and
first and second contacts on the semiconductor layer structure,
wherein the drift region comprises a wide bandgap semiconductor material, and
wherein the drift region is configured to provide unipolar conduction between the first and second contacts below a current density threshold, and bipolar conduction between the first and second contacts above the current density threshold, and
wherein the drift region is configured to transition from the bipolar conduction to the unipolar conduction responsive to a current level falling below the current density threshold.

2. The power semiconductor device of claim 1, wherein the drift region comprises a concentration of dopants of the first conductivity type of greater than about $5 \times 10^{14}$ atoms/cm$^3$, and wherein a concentration of dopants of a second conductivity type in the drift region is less than that of the first conductivity type.

3. The power semiconductor device of claim 2, wherein the first concentration of dopants in the drift region is about $5 \times 10^{14}$ to $5 \times 10^{17}$ atoms/cm$^3$.

4. The power semiconductor device of claim 1, wherein the first and second contacts are on opposing first and second surfaces of the semiconductor layer structure, and wherein the drift region further comprises a plurality of discrete minority carrier recombination sites that are spaced apart from the first and second surfaces.

5. The power semiconductor device of claim 4, wherein the discrete minority carrier recombination sites comprise a plurality of doped regions of the first and/or second conductivity types having a higher dopant concentration than the drift region.

6. The power semiconductor device of claim 4, wherein the discrete minority carrier recombination sites comprise defects in a crystal lattice of the drift region.

7. The power semiconductor device of claim 6, wherein the discrete minority carrier recombination sites comprise argon and/or hydrogen.

8. The power semiconductor device of claim 4, wherein the discrete minority carrier recombination sites are positioned at a depth that is about 15% to about 85% of a thickness defined between the first and second surfaces of the semiconductor layer structure.

9. The power semiconductor device of claim 1, further comprising:
a gate adjacent a first surface of the semiconductor layer structure,
wherein the first and second contacts comprise a source contact on the first surface of the semiconductor layer structure, and a drain contact on a second surface of the semiconductor layer structure opposite the first surface.

10. The power semiconductor device of claim 9, wherein the semiconductor layer structure further comprises:
a collector region of a second conductivity type between the drift region and the drain contact; and
at least one drain gap of the first conductivity type in the collector region adjacent the drain contact.

11. The power semiconductor device of claim 10, wherein the semiconductor layer structure further comprises:
a field stop region of the first conductivity type between the collector region and the drift region,
wherein the current density threshold is configured to forward bias a p-n junction between the collector region and the field stop region.

12. The power semiconductor device of claim 11, wherein the semiconductor layer structure further comprises:
a semiconductor layer between the drain contact and the drift region, wherein the semiconductor layer defines a heterojunction with the wide bandgap semiconductor material of the drift region and comprises the field stop region, the collector region, and the at least one drain gap therein.

13. The power semiconductor device of claim 1, wherein the drift region is configured to provide the unipolar conduction responsive to application of a voltage to a gate thereon, and is configured to transition to the bipolar conduction after the unipolar conduction is initiated and the current level exceeds the current density threshold.

14. The power semiconductor device of claim 1, wherein the drift region is configured to provide minority carrier recombination in an interval between switching-off of the bipolar conduction and switching-off of the unipolar conduction.

15. A power semiconductor device, comprising:
a semiconductor layer structure comprising a drift region of a first conductivity type and a collector region of a second conductivity type; and
first and second contacts on opposing first and second surfaces of the semiconductor layer structure, respectively,
wherein the collector region is between the drift region and the second surface,
wherein the drift region comprises a first concentration of dopants of the first conductivity type of greater than about $5\times10^{14}$ atoms/cm$^3$, wherein a second concentration of dopants of the second conductivity type in the drift region is less than the first concentration, and
wherein the drift region is configured to transition from bipolar conduction to unipolar conduction between the first and second contacts responsive to a current level falling below a current density threshold.

16. The power semiconductor device of claim 15, wherein the drift region is configured to provide the unipolar conduction between the first and second contacts below the current density threshold, and the bipolar conduction between the first and second contacts above the current density threshold.

17. The power semiconductor device of claim 16, wherein the semiconductor layer structure further comprises:
a field stop region of the first conductivity type between the collector region and the drift region,
wherein the current density threshold is configured to forward bias a p-n junction between the collector region and the field stop region.

18. The power semiconductor device of claim 17, wherein the semiconductor layer structure further comprises:
at least one drain gap of the first conductivity type in the collector region.

19. The power semiconductor device of claim 18, wherein the semiconductor layer structure further comprises source regions of the first conductivity type and well regions of a second conductivity type adjacent the first surface, and the first and second contacts comprise a source contact on the first surface and a drain contact on the second surface.

20. The power semiconductor device of claim 19, wherein the drift region comprises a wide bandgap semiconductor material, and further comprising:
a semiconductor layer between the drain contact and the drift region, wherein the semiconductor layer defines a heterojunction with the wide bandgap semiconductor material of the drift region and comprises the field stop region, the collector region, and the at least one drain gap.

21. The power semiconductor device of claim 16, wherein the second concentration of dopants is insufficient to cancel charges in adjacent portions of the drift region comprising the first concentration of dopants under reverse bias.

22. The power semiconductor device of claim 15, wherein the drift region further comprises a plurality of discrete minority carrier recombination sites that are spaced apart from the opposing first and second surfaces.

23. The power semiconductor device of claim 15, wherein the first concentration of dopants in the drift region is about $5\times10^{14}$ to $5\times10^{17}$ atoms/cm$^3$3.

24. A power semiconductor device, comprising:
a semiconductor layer structure comprising a drift region of a first conductivity type; and
first and second contacts on opposing first and second surfaces of the semiconductor layer structure, respectively,
wherein the drift region is configured to provide bipolar conduction of minority carriers and majority carriers between the first and second contacts, and comprises a plurality of discrete minority carrier recombination sites that are spaced apart from the first and second surfaces and are configured to transition the bipolar conduction to unipolar conduction of the majority carriers between the first and second contacts.

25. The power semiconductor device of claim 24, wherein the semiconductor layer structure further comprises source regions of the first conductivity type and well regions of a second conductivity type adjacent the first surface, and the first and second contacts comprise a source contact on the first surface and a drain contact on the second surface.

26. The power semiconductor device of claim 25, further comprising:
a gate adjacent the first surface, wherein the discrete minority carrier recombination sites are between the gate and the drain contact.

27. The power semiconductor device of claim 26, wherein the discrete minority carrier recombination sites are positioned at a depth that is about 15% to about 85% of a thickness defined between the first and second surfaces of the semiconductor layer structure.

28. The power semiconductor device of claim 25, wherein the discrete minority carrier recombination sites are laterally spaced apart from one another by a spacing of about 0.2 µm to about 2.0 µm.

29. The power semiconductor device of claim 25, further comprising:
a collector region of the second conductivity type between the drift region and the drain contact;
a field stop region of the first conductivity type between the collector region and the drift region; and
at least one drain gap of the first conductivity type in the collector region adjacent the drain contact.

30. The power semiconductor device of claim 29, wherein the drift region comprises a wide bandgap semiconductor material.

31. The power semiconductor device of claim 30, further comprising:
a semiconductor layer between the drain contact and the drift region, wherein the semiconductor layer defines a heterojunction with the wide bandgap semiconductor material of the drift region and comprises the field stop region, the collector region, and the at least one drain gap.

32. The power semiconductor device of claim 24, wherein the discrete minority carrier recombination sites comprise a plurality of doped regions of the first and/or second conductivity types having a higher dopant concentration than the drift region.

33. The power semiconductor device of claim 24, wherein the discrete minority carrier recombination sites comprise defects in a crystal lattice of the drift region.

34. The power semiconductor device of claim 33, wherein the discrete minority carrier recombination sites comprise argon and/or hydrogen.

35. The power semiconductor device of claim 24, wherein the drift region is configured to provide the unipolar conduction of the majority carriers between the first and second contacts below a current density threshold, and the bipolar conduction of minority carriers and the majority carriers between the first and second contacts above the current density threshold.

36. A method of fabricating a power semiconductor device, the method comprising:
forming a semiconductor layer structure comprising a drift region of a first conductivity type that is configured to provide bipolar conduction of minority and majority carriers; and
forming a plurality of discrete minority carrier recombination sites in the drift region, wherein the discrete minority carrier recombination sites are spaced apart from opposing first and second surfaces of the semiconductor layer structure and are configured to transition the bipolar conduction to unipolar conduction of the majority carriers.

37. The method of claim 36, wherein:
forming the semiconductor layer structure comprises forming the drift region on a substrate using an epitaxial growth process such that the first surface is opposite the substrate; and
forming the discrete minority carrier recombination sites comprises implanting ions into the drift region,
wherein the ions are implanted into the first surface during a break in the epitaxial growth process, or the ions are implanted into the second surface after removing the substrate responsive to completion of the epitaxial growth process.

38. The method of claim 37, wherein the ions comprise dopants of the first and/or second conductivity types, and wherein the implanting forms the discrete minority carrier recombination sites as a plurality of doped regions with a higher dopant concentration than the drift region.

39. The method of claim 37, wherein the ions comprise a neutral species, and wherein the implanting forms the discrete minority carrier recombination sites as defects in a crystal lattice of the drift region.

40. The method of claim 37 wherein the implanting forms the discrete minority carrier recombination sites at a depth that is about 15% to about 85% of a thickness defined between the first and second surfaces of the semiconductor layer structure.

41. The method of claim 36, wherein forming a semiconductor layer structure further comprises:
forming a field stop region of the first conductivity type adjacent the drift region;
forming a collector region of the second conductivity type adjacent the field stop region; and
forming and at least one drain gap of the first conductivity type between portions of the collector region,
wherein the at least one drain gap is configured to provide the unipolar conduction between first and second contacts on the opposing first and second surfaces of the semiconductor layer structure below a current density threshold, and wherein a p-n junction between the collector region and the field stop region is configured to provide the bipolar conduction between the first and second contacts above the current density threshold.

42. The method of claim 41, wherein forming the backside structure comprises:
implanting ions into the second surface to form the field stop region, the collector region, and the at least one drain gap.

43. The method of claim 41, wherein forming the backside structure comprises:
removing the substrate to expose a surface of the drift region opposite the first surface;
forming a semiconductor layer on the surface of the drift region, wherein the semiconductor layer defines a heterojunction with the wide bandgap semiconductor material of the drift region; and
implanting ions into the semiconductor layer to form the field stop region, the collector region, and the at least one drain gap.

* * * * *

UNITED STATES PATENT AND TRADEMARK OFFICE
CERTIFICATE OF CORRECTION

PATENT NO. : 12,317,559 B2
APPLICATION NO. : 17/589929
DATED : May 27, 2025
INVENTOR(S) : Thomas E. Harrington, III It is certified that error appears in the above-identified patent and that said Letters Patent is hereby corrected as shown below:

In the Specification

Column 9, Line 55: Please correct "gate ox insulating ide layer" to read --gate insulating layer--

Column 10, Line 21: Please correct "NiSix" to read --$NiSi_x$--

Column 10, Line 58: Please correct "Rds" to read --$R_{ds}$--

Column 10, Line 67: Please correct "jth" to read --$j_{th}$--

Column 11, Line 4: Please correct "jth" to read --$j_{th}$--

Column 11, Line 7: Please correct "jth" to read --$j_{th}$--

Column 14, Line 7: Please correct "(e.g., n)" to read --(e.g., $n^-$)--

Column 15, Line 35: Please correct "jth" to read --$j_{th}$--

In the Claims

Column 22, Line 50, Claim 23: Please correct "atoms/cm$^3$3." to read --atoms/cm$^3$.--

Signed and Sealed this
Sixteenth Day of September, 2025

Coke Morgan Stewart
*Acting Director of the United States Patent and Trademark Office*